(12) United States Patent
Wang et al.

(10) Patent No.: US 11,967,497 B2
(45) Date of Patent: Apr. 23, 2024

(54) METHODS AND APPARATUS FOR CLEANING SEMICONDUCTOR WAFERS

(71) Applicant: ACM Research (Shanghai) Inc., Shanghai (CN)

(72) Inventors: Jun Wang, Shanghai (CN); Hui Wang, Shanghai (CN); Fufa Chen, Shanghai (CN); Fuping Chen, Shanghai (CN); Jian Wang, Shanghai (CN); Xi Wang, Shanghai (CN); Xiaoyan Zhang, Shanghai (CN); Yinuo Jin, Shanghai (CN); Zhaowei Jia, Shanghai (CN); Liangzhi Xie, Shanghai (CN); Xuejun Li, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 346 days.

(21) Appl. No.: 17/575,244

(22) Filed: Jan. 13, 2022

(65) Prior Publication Data
US 2022/0139697 A1  May 5, 2022

Related U.S. Application Data

(63) Continuation of application No. 16/092,193, filed as application No. PCT/CN2016/078510 on Apr. 6, 2016, now Pat. No. 11,257,667.

(51) Int. Cl.
*H01L 21/02* (2006.01)
*B08B 3/12* (2006.01)
(Continued)

(52) U.S. Cl.
CPC .......... *H01L 21/02057* (2013.01); *B08B 3/12* (2013.01); *B08B 13/00* (2013.01); *G08B 21/182* (2013.01); *H01L 21/67051* (2013.01)

(58) Field of Classification Search
CPC ......... H01L 21/02057; H01L 21/67051; H01L 21/67253; H01L 21/67057;
(Continued)

(56) References Cited

U.S. PATENT DOCUMENTS

| 5,044,543 | A | 9/1991 | Yamazaki et al. |
| 5,625,249 | A | 4/1997 | Grant |

(Continued)

FOREIGN PATENT DOCUMENTS

| CN | 101087007 A | 12/2007 |
| CN | 101879511 A | 11/2010 |

(Continued)

OTHER PUBLICATIONS

International Search Report and Written Opinion for International PCT Application No. PCT/CN2016/078510, dated Jan. 11, 2017.

*Primary Examiner* — Alexander Markoff
(74) *Attorney, Agent, or Firm* — K&L Gates LLP

(57) ABSTRACT

A method for cleaning semiconductor substrate without damaging patterned structure on the semiconductor substrate using ultra/mega sonic device comprises applying liquid into a space between a substrate and an ultra/mega sonic device; setting an ultra/mega sonic power supply at frequency $f_1$ and power $P_1$ to drive the ultra/mega sonic device; before bubble cavitation in the liquid damaging patterned structure on the substrate, setting the ultra/mega sonic power supply at zero output; after temperature inside bubble cooling down to a set temperature, setting the ultra/mega sonic power supply at frequency $f_1$ and power $P_1$ again; detecting power on time at power P1 and frequency f1 and power off time separately or detecting amplitude of each waveform output by the ultra/mega sonic power supply; comparing the detected power on time with a preset time $\tau_1$, or comparing the detected power off time with a preset time $\tau_2$, or comparing detected amplitude of each (Continued)

waveform with a preset value, if the detected power on time is longer than the preset time $\tau_1$, or the detected power off time is shorter than the preset time $\tau_2$, or the detected amplitude of any waveform is larger than the preset value, shut down the ultra/mega sonic power supply and send out an alarm signal.

16 Claims, 29 Drawing Sheets

(51) Int. Cl.
  *B08B 13/00* (2006.01)
  *G08B 21/18* (2006.01)
  *H01L 21/67* (2006.01)

(58) Field of Classification Search
  CPC ..... H01L 21/02052; B08B 3/12; B08B 13/00; G08B 21/182
  See application file for complete search history.

(56) References Cited

U.S. PATENT DOCUMENTS

| | | | |
|---|---|---|---|
| 5,777,860 A | 7/1998 | Halbert | |
| 6,313,565 B1 | 11/2001 | Puskas | |
| 7,119,019 B2 | 10/2006 | O'Brien et al. | |
| 7,247,977 B2 | 7/2007 | Goodson | |
| 7,306,002 B2 | 12/2007 | Kim et al. | |
| 7,495,371 B2 | 2/2009 | Goodson | |
| 7,598,654 B2 | 10/2009 | Goodson | |
| 8,310,131 B2 | 11/2012 | Goodson | |
| 8,936,032 B2 | 1/2015 | Goodson | |
| 9,159,311 B2 | 10/2015 | Goodson | |
| 11,257,667 B2 * | 2/2022 | Wang | G08B 21/182 |
| 2001/0013355 A1 | 8/2001 | Busnaina | |
| 2002/0043893 A1 | 4/2002 | Puskas | |
| 2002/0195133 A1 | 12/2002 | Miranda et al. | |
| 2003/0028287 A1 * | 2/2003 | Puskas | B06B 1/0269 700/266 |
| 2004/0163682 A1 | 8/2004 | Boyd et al. | |
| 2006/0054182 A1 | 3/2006 | Korbler et al. | |
| 2006/0260639 A1 | 11/2006 | Fani et al. | |
| 2006/0286808 A1 | 12/2006 | Kashkoush | |
| 2007/0205695 A1 * | 9/2007 | Puskas | B01J 19/10 310/317 |
| 2008/0047575 A1 * | 2/2008 | Puskas | B08B 3/12 134/1 |
| 2008/0129146 A1 * | 6/2008 | Puskas | B06B 1/0284 310/317 |
| 2010/0139710 A1 | 6/2010 | Wang et al. | |
| 2011/0041871 A1 | 2/2011 | Fan | |
| 2012/0097195 A1 | 4/2012 | Wang et al. | |
| 2014/0216508 A1 | 8/2014 | Korbler | |
| 2020/0335325 A1 | 10/2020 | Wang et al. | |

FOREIGN PATENT DOCUMENTS

| | | |
|---|---|---|
| CN | 103736690 A | 4/2014 |
| CN | 104889102 A | 9/2015 |
| CN | 104900480 A | 9/2015 |
| CN | 105414084 A | 3/2016 |
| EP | 0430072 A2 | 11/1990 |
| JP | H06296942 A | 10/1994 |
| JP | 2001179195 A | 7/2001 |
| JP | 2002289565 A | 10/2002 |
| JP | 2007165695 A | 6/2007 |
| JP | 2013021160 A | 1/2013 |
| KR | 20150113177 A | 10/2015 |

* cited by examiner

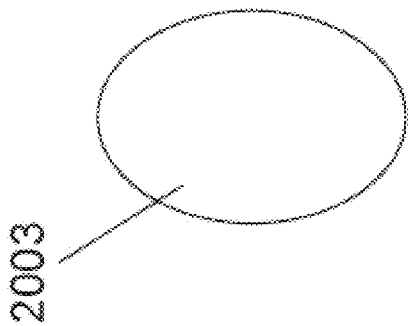
Fig. 2D
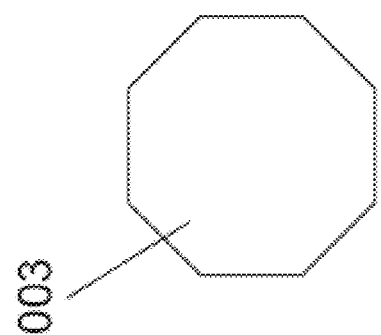
Fig. 2C
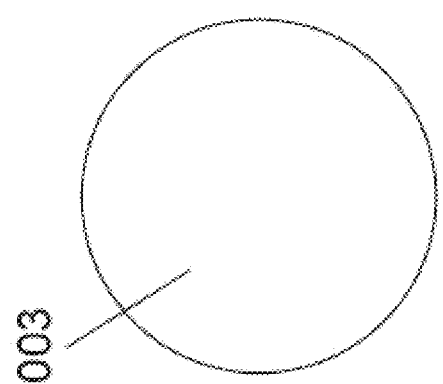
Fig. 2G
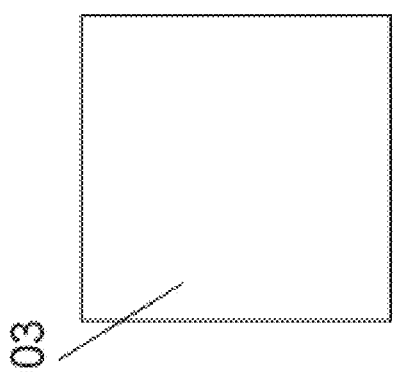
Fig. 2B
Fig. 2F
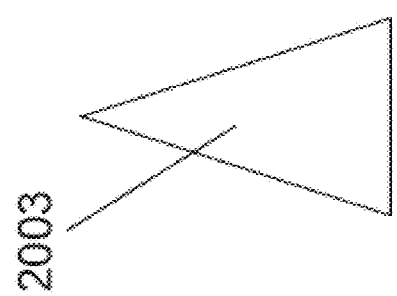
Fig. 2A
Fig. 2E

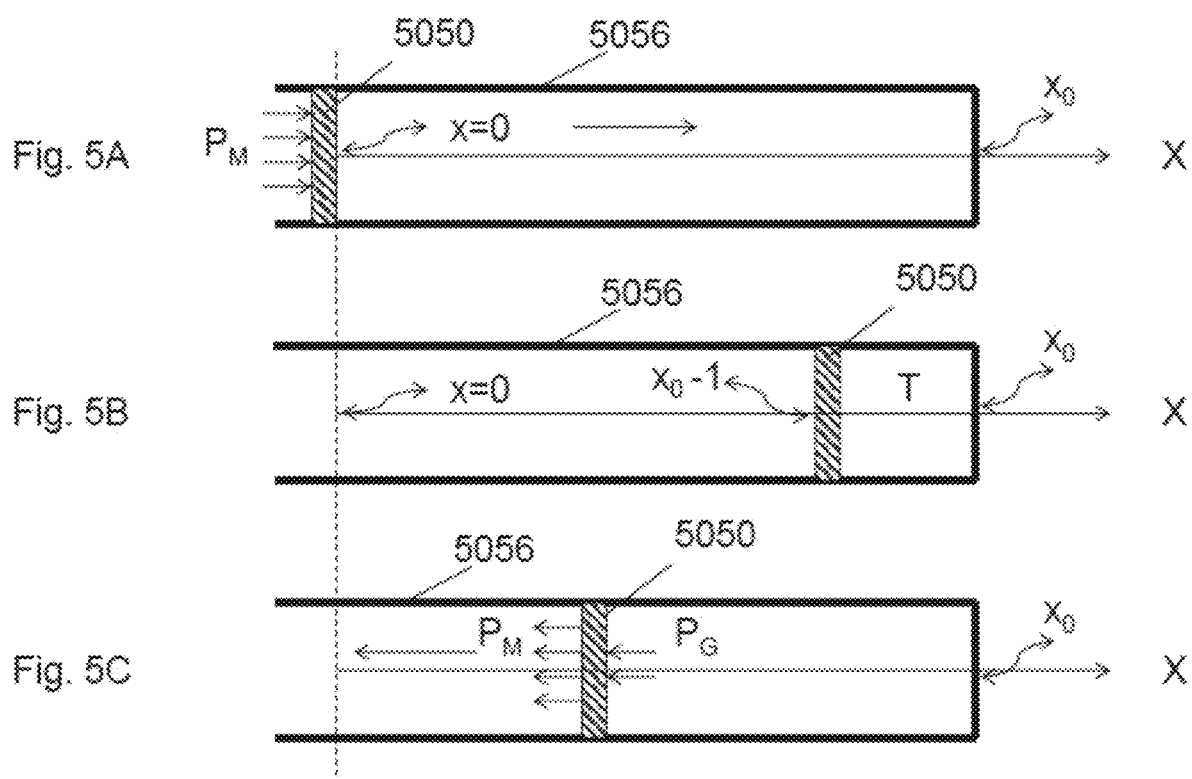

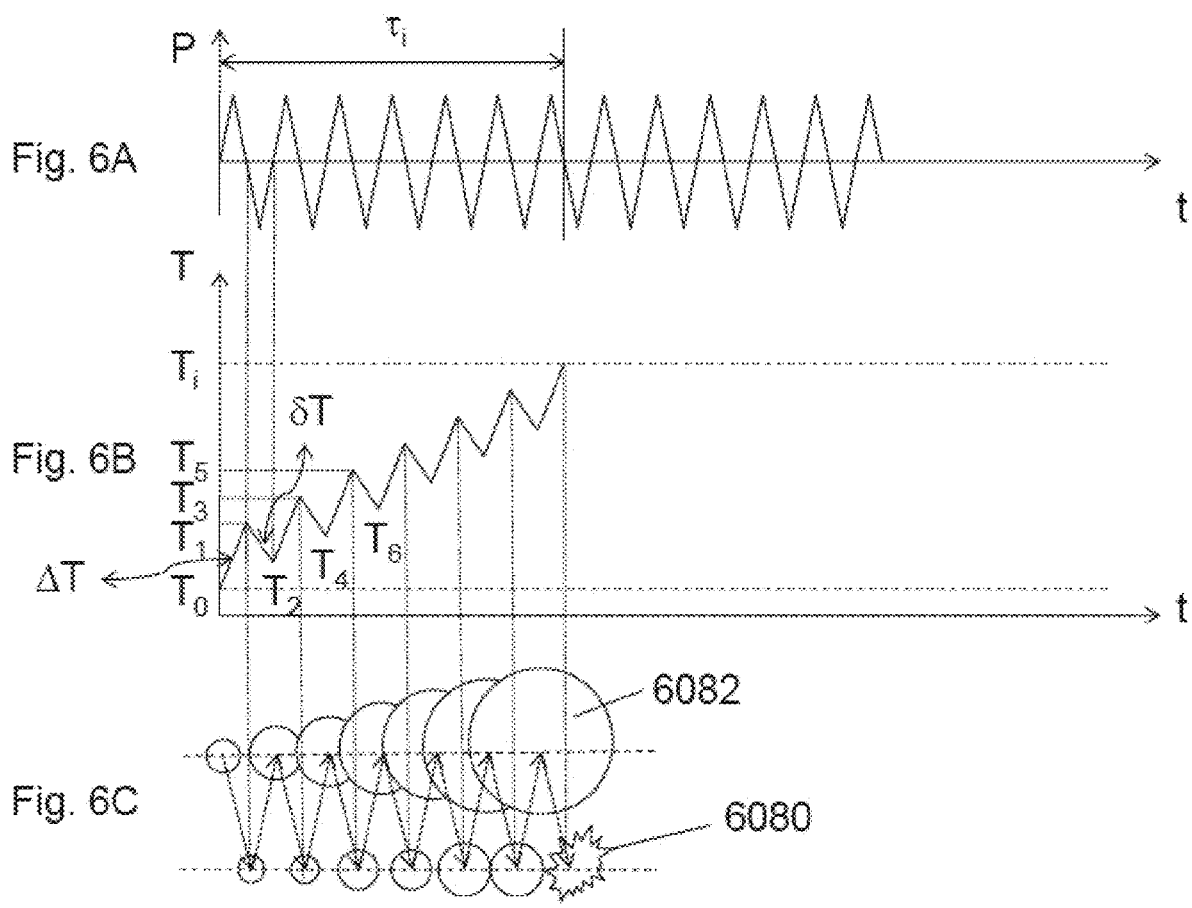

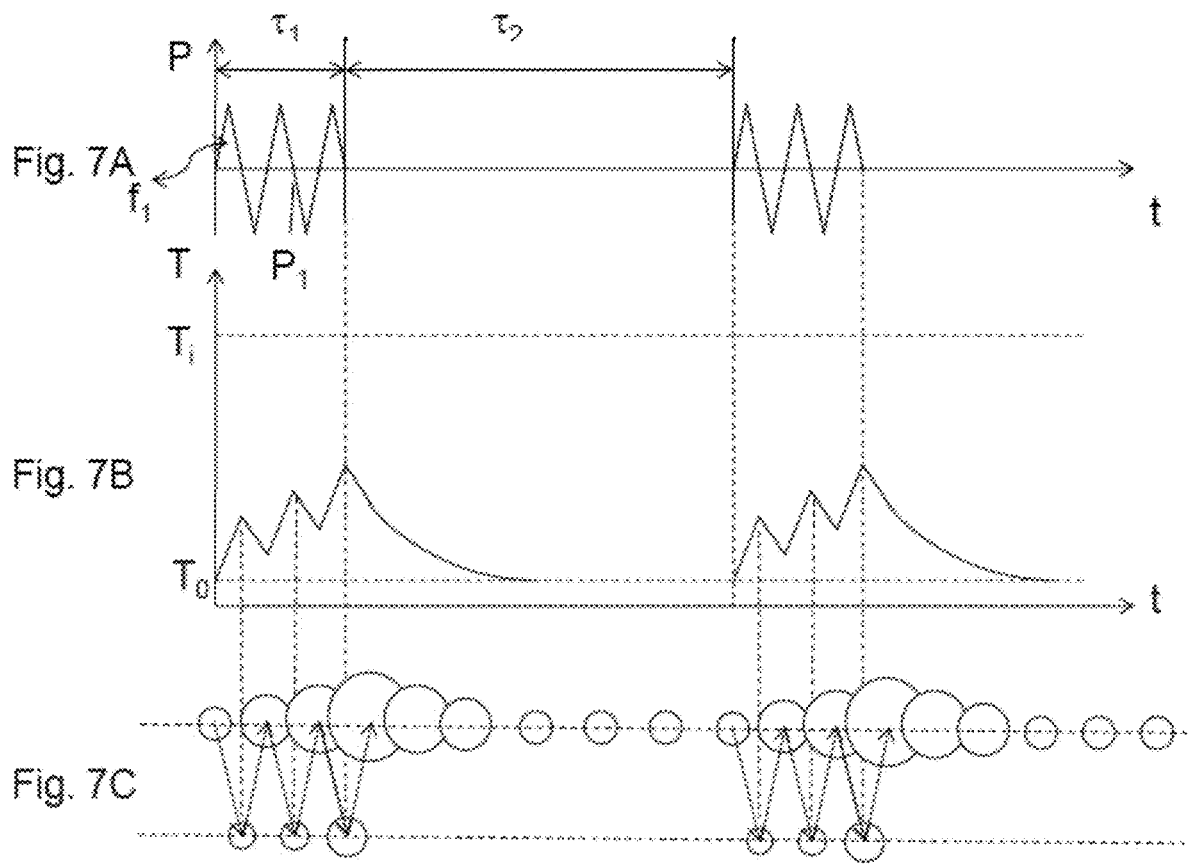

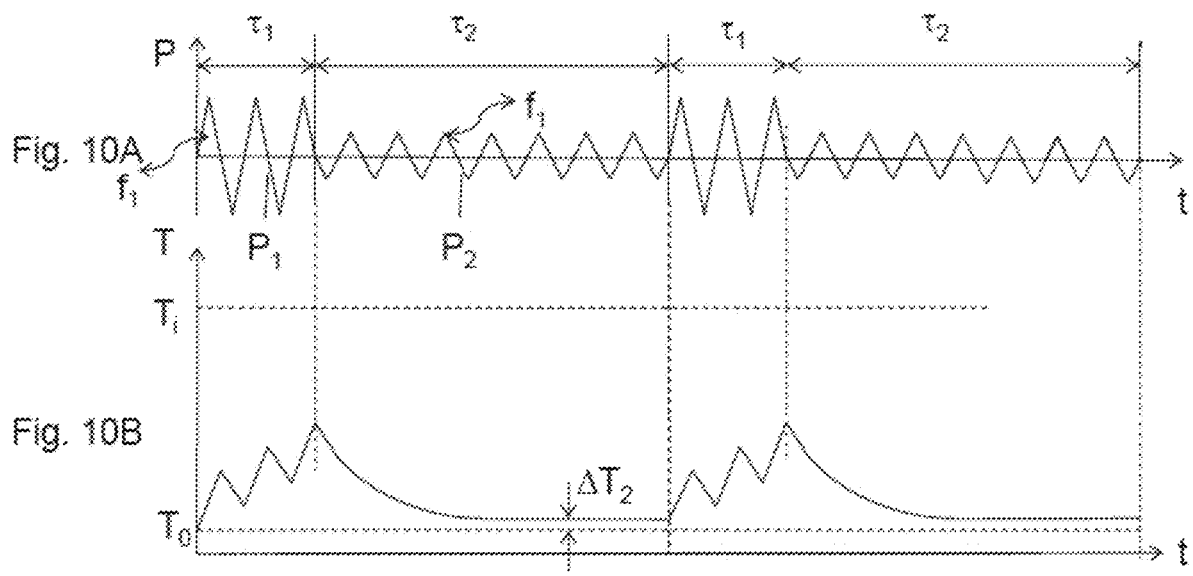

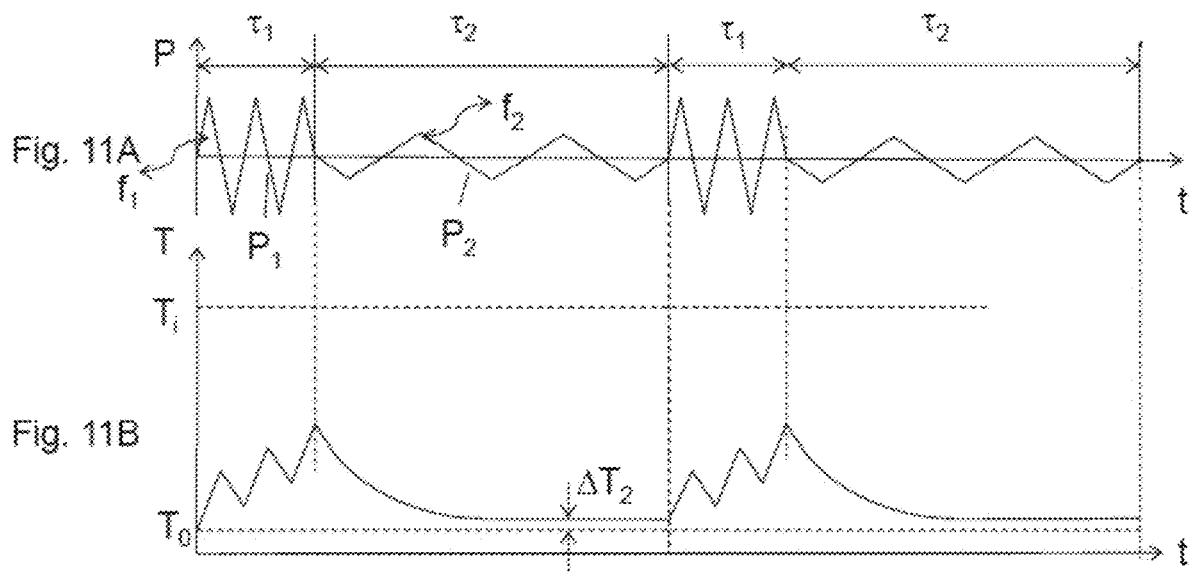

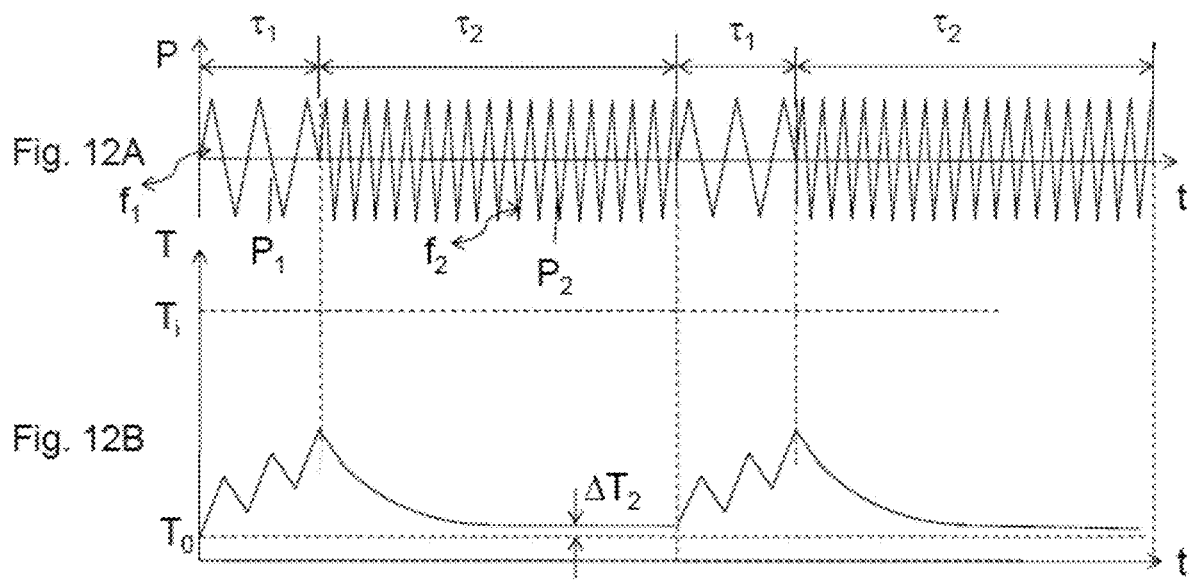

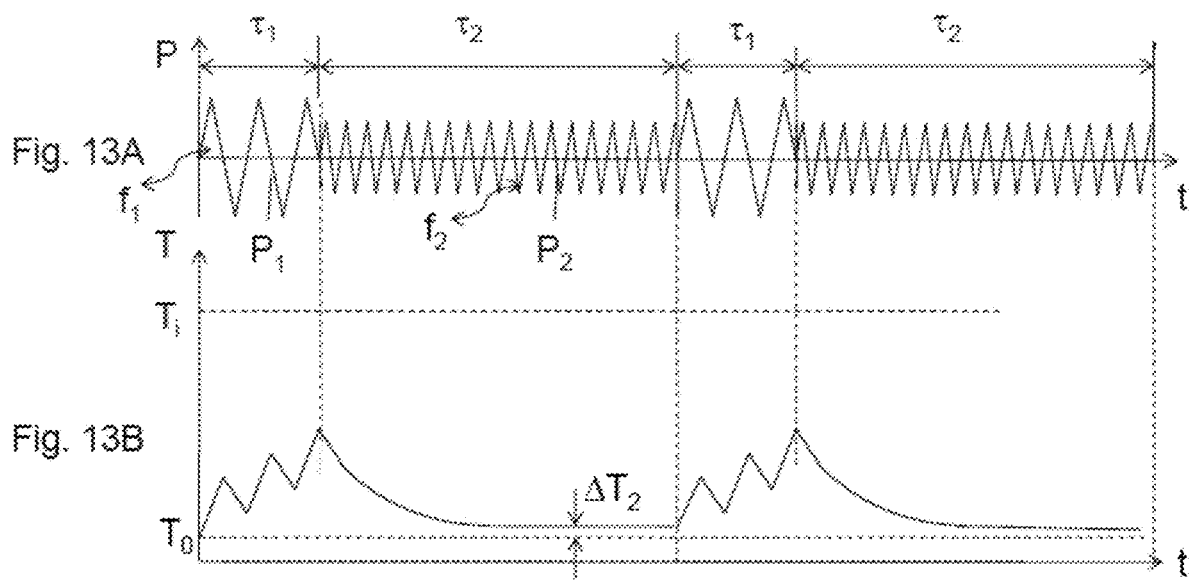

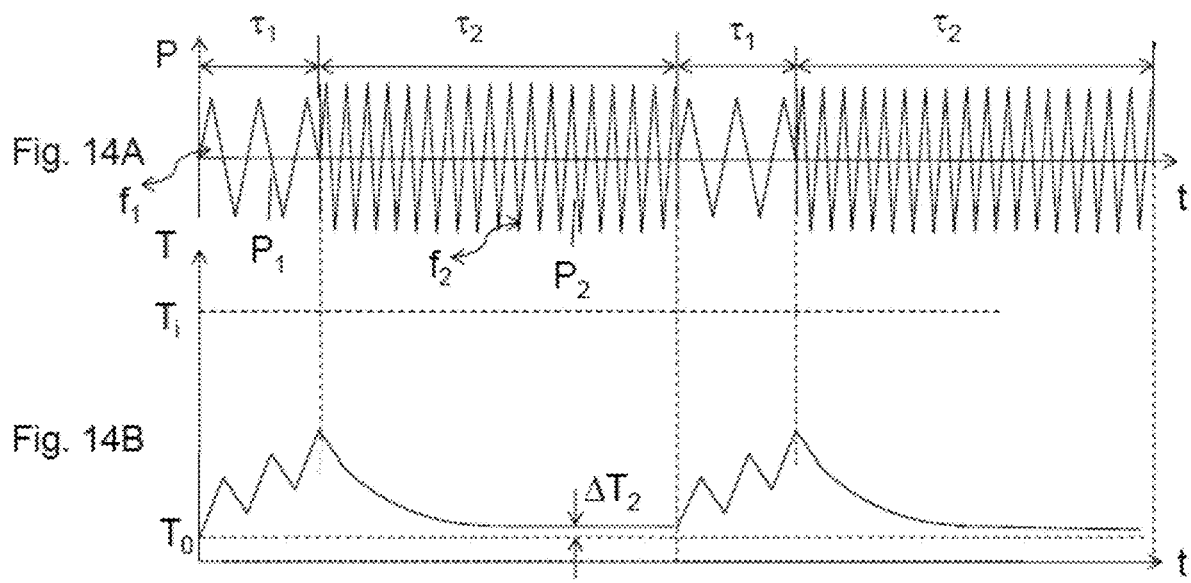

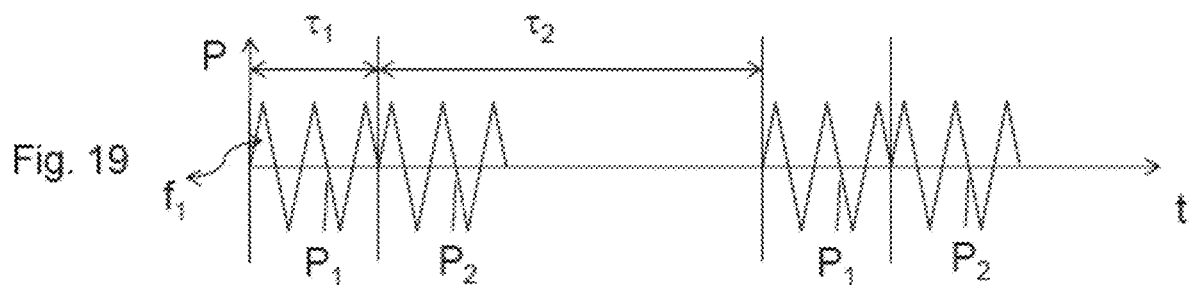

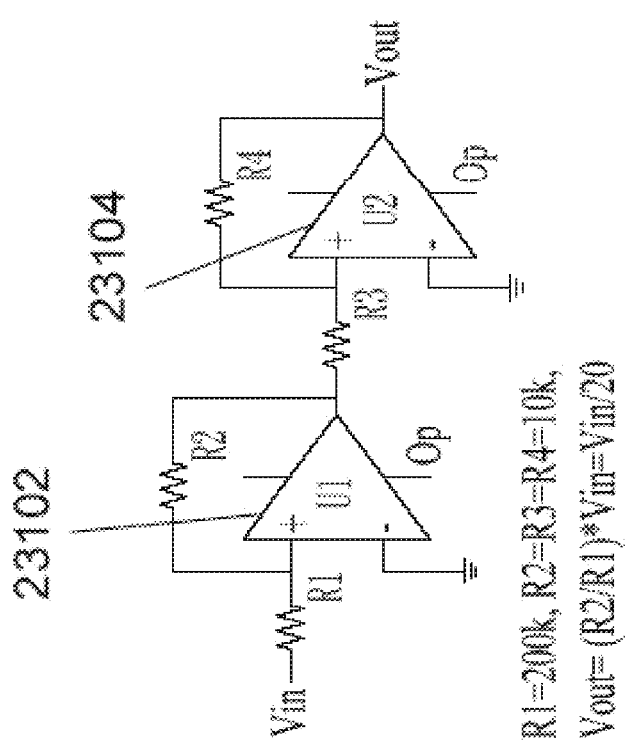

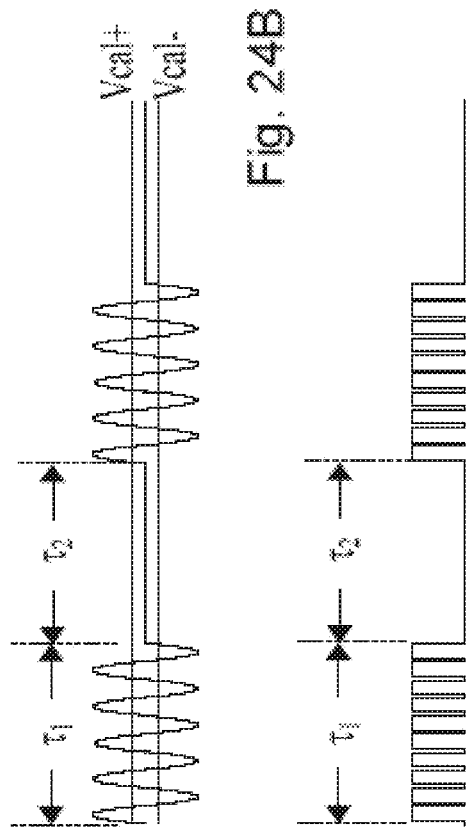
Fig. 24B
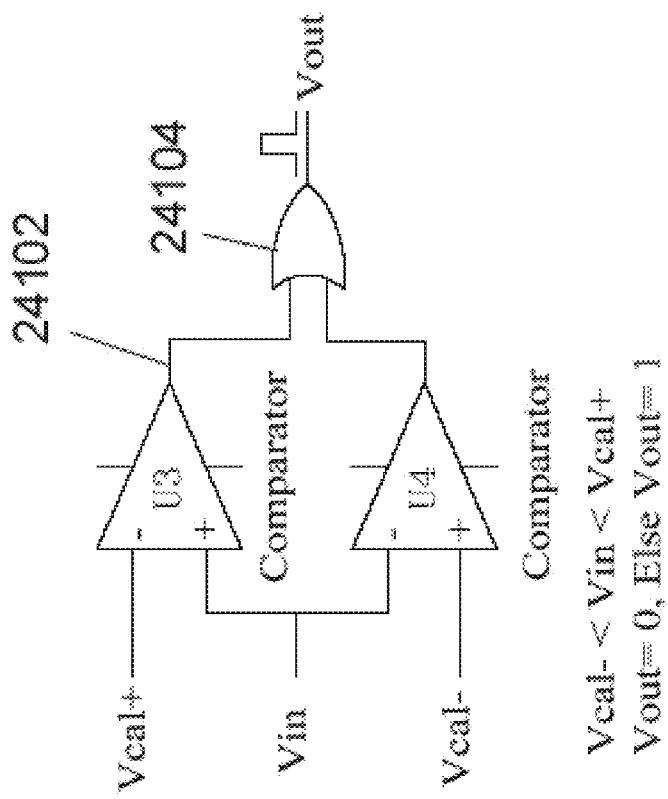
Fig. 24C
Fig. 24A
Comparator
Vcal- < Vin < Vcal+
Vout= 0, Else Vout= 1

METHODS AND APPARATUS FOR CLEANING SEMICONDUCTOR WAFERS

CROSS-REFERENCE TO RELATED APPLICATION

This application is a continuation application claiming priority under 35 U.S.C. § 120 to U.S. patent application Ser. No. 16/092,193, entitled METHODS AND APPARATUS FOR CLEANING SEMICONDUCTOR WAFERS, which is a U.S. National Stage Entry under 35 U.S.C. § 371 of International Patent Application No. PCT/CN2016/078510, entitled METHODS AND APPARATUS FOR CLEANING SEMICONDUCTOR WAFERS, filed Apr. 6, 2016, the entire disclosures of which are hereby incorporated by reference herein in their entireties.

FIELD OF THE INVENTION

The present invention generally relates to methods and apparatus for cleaning semiconductor wafers, and more particularly, relates to controlling the bubble cavitation generated by an ultra or mega sonic device during the cleaning process to achieve a stable or controlled cavitation on the entire semiconductor wafer, which removes fine particles efficiently without damaging the device structure on the semiconductor wafer.

BACKGROUND

Semiconductor devices are manufactured or fabricated on semiconductor wafers using a number of different processing steps to create transistor and interconnection elements. Recently, the transistors are built from two dimensions to three dimensions such as finFET transistors. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the finFET transistors and interconnection elements the semiconductor wafer may undergo, for example, masking, etching, and deposition processes to form the desired electronic circuitry of the semiconductor devices. In particular, multiple masking and plasma etching step can be performed to form a pattern of finFET and or recessed areas in a dielectric layer on a semiconductor wafer that serve as fin for the transistor and or trenches and vias for the interconnection elements. In order to remove particles and contaminations in fin structure and or trench and via post etching or photo resist ashing, a wet cleaning step is necessary. Especially, when device manufacture node migrating to 14 or 16 nm and beyond, the side wall loss in fin and or trench and via is crucial for maintaining the critical dimension. In order to reduce or eliminate the side wall loss, it is important to use moderate, dilute chemicals, or sometime de-ionized water only. However, the dilute chemical or de-ionized water usually is not efficient to remove the particles in the fin structure and or trench and via. Therefore the mechanical force such as ultra or mega sonic is needed in order to remove those particles efficiently. Ultra sonic or mega sonic wave will generate bubble cavitation which applies mechanical force to the wafer structure, the violent cavitation such as transit cavitation or micro jet will damage those patterned structures. To maintain a stable or controlled cavitation is key parameters to control the mechanical force within the damage limit and at the same time efficiently to remove the particles.

Mega sonic energy coupled with nozzle to clean semiconductor wafer is disclosed in U.S. Pat. No. 4,326,553. The fluid is pressurized and mega sonic energy is applied to the fluid by a mega sonic transducer. The nozzle is shaped to provide a ribbon-like jet of cleaning fluid vibrating at ultra/mega sonic frequencies for the impingement on the surface.

A source of energy vibrates an elongated probe which transmits the acoustic energy into the fluid is disclosed in U.S. Pat. No. 6,039,059. In one arrangement, fluid is sprayed onto both sides of a wafer while a probe is positioned close to an upper side. In another arrangement, a short probe is positioned with its end surface close to the surface, and the probe is moved over the surface as wafer rotates.

A source of energy vibrates a rod which rotates around it axis parallel to wafer surface is disclosed in U.S. Pat. No. 6,843,257 B2. The rod surface is etched to curve groves, such as spiral groove.

It is needed to have a better method for controlling the bubble cavitation generated by an ultra or mega sonic device during the cleaning process to achieve a stable or controlled cavitation on the entire semiconductor wafer, which removes fine particles efficiently without damaging the device structure on the semiconductor wafer.

SUMMARY

One method of the present invention is to achieve a damage free ultra or mega sonic cleaning on a semiconductor wafer with patterned structure by maintaining a stable bubble cavitation. The stable bubble cavitation is controlled by setting a sonic power supply with power $P_1$ at a time interval shorter than $\tau_1$, and setting the sonic power supply with power $P_2$ at a time interval longer than $\tau_2$, and repeating above steps till the semiconductor wafer is cleaned, where power $P_2$ is equal to zero or much smaller than power $P_1$, $\tau_1$ is a time interval that the temperature inside bubble raises to a critical implosion temperature; and $\tau_2$ is a time interval that the temperature inside bubble falls down to a temperature much lower than the critical implosion temperature.

Another method of the present invention is to achieve a damage free ultra or mega sonic cleaning on a semiconductor wafer with patterned structure by maintaining a stable bubble cavitation. The stable bubble cavitation is controlled by setting a sonic power supply with frequency $f_1$ at a time interval shorter than $\tau_1$, and setting the sonic power supply with frequency $f_2$ at a time interval longer than $\tau_2$, and repeating above steps till the semiconductor wafer is cleaned, where $f_2$ is much higher than $f_1$, better to be 2 times or 4 times higher, $\tau_1$ is a time interval that the temperature inside bubble raises to a critical implosion temperature; and $\tau_2$ is a time interval that the temperature inside bubble falls down to a temperature much lower than the critical implosion temperature.

Another method of the present invention is to achieve a damage free ultra or mega sonic cleaning on a semiconductor wafer with patterned structure by maintaining a stable bubble cavitation with bubble size less than space in patterned structure. The stable bubble cavitation with bubble size less than space in patterned structure is controlled by setting a sonic power supply at power $P_1$ for a time interval shorter than $\tau_1$, and setting the sonic power supply at power $P_2$ for a time interval longer than $\tau_2$, and repeating above steps till the semiconductor wafer is cleaned, where $P_2$ is equal to zero or much smaller than $P_1$, $\tau_1$ is a time interval that the bubble size increases to a critical size equal to or larger than the space in patterned structure; and $\tau_2$ is a time interval that the bubble size decreases to a value much smaller than the space in patterned structure.

Another method of the present invention is to achieve a damage free ultra or mega sonic cleaning on a semiconductor wafer with patterned structure by maintaining a stable bubble cavitation with bubble size less than space in patterned structure. The stable bubble cavitation with bubble size less than space in patterned structure is controlled by setting a sonic power supply with frequency $f_1$ for a time interval shorter than $\tau_1$, and setting the sonic power supply with frequency $f_2$ for a time interval longer than $\tau_2$, and repeating above steps till the semiconductor wafer is cleaned, where $f_2$ is much higher than $f_1$, better to be 2 times or 4 times higher, $\tau_1$ is a time interval that the bubble size increases to a critical size equal to or larger than the space in patterned structure; and $\tau_2$ is a time interval that the bubble size decreases to a value much smaller than the space in patterned structure.

Another method of the present invention is to achieve a damage free ultra or mega sonic cleaning on a semiconductor wafer with patterned structure by monitoring the ultra or mega sonic power supply operation status for maintaining a stable bubble cavitation. The method comprises the following steps: applying liquid into a space between a semiconductor wafer and an ultra or mega sonic device; setting an ultra or mega sonic power supply at frequency $f_1$ and power $P_1$ to drive the ultra or mega sonic device; before bubble cavitation in the liquid damaging patterned structure on the semiconductor wafer, setting the ultra or mega sonic power supply at zero output; after temperature inside bubble cooling down to a set temperature, setting the ultra or mega sonic power supply at frequency $f_1$ and power $P_1$ again; detecting power on time at power $P_1$ and frequency $f_1$ and power off time separately; comparing the detected power on time at power $P_1$ and frequency $f_1$ with a preset time $\tau_1$, if the detected power on time is longer than the preset time $\tau_1$, shut down the ultra or mega sonic power supply and send out an alarm signal; comparing the detected power off time with a preset time $\tau_2$, if the detected power off time is shorter than the preset time $\tau_2$, shut down the ultra or mega sonic power supply and send out an alarm signal; repeating above steps till the semiconductor wafer is cleaned.

Another method of the present invention is to achieve a damage free ultra or mega sonic cleaning on a semiconductor wafer with patterned structure by monitoring the ultra or mega sonic power supply operation status for maintaining a stable bubble cavitation. The method comprises the following steps: applying liquid into a space between a semiconductor wafer and an ultra or mega sonic device; setting an ultra or mega sonic power supply at frequency $f_1$ and power $P_1$ to drive the ultra or mega sonic device; before bubble cavitation in the liquid damaging patterned structure on the semiconductor wafer, setting the ultra or mega sonic power supply at zero output; after temperature inside bubble cooling down to a set temperature, setting the ultra or mega sonic power supply at frequency $f_1$ and power $P_1$ again; detecting amplitude of each waveform output by the ultra or mega sonic power supply; comparing detected amplitude of each waveform with a preset value, if the detected amplitude of any waveform is larger than the preset value, shut down the ultra or mega sonic power supply and send out an alarm signal, where the preset value is larger than waveform amplitude at normal operation; repeating above steps till the semiconductor wafer is cleaned.

BRIEF DESCRIPTION OF THE DRAWINGS

FIGS. 2A-2G depict variety of shape of ultra or mega sonic transducers;

FIGS. 5A-5C depict thermal energy variation inside bubble during wafer cleaning process;

FIGS. 6A-6C depict an exemplary wafer cleaning method;

FIGS. 7A-7C depict another exemplary wafer cleaning method;

FIGS. 10A-10B depict another exemplary wafer cleaning method;

FIGS. 11A-11B depict another exemplary wafer cleaning method;

FIGS. 12A-12B depict another exemplary wafer cleaning method;

FIGS. 13A-13B depict another exemplary wafer cleaning method;

FIGS. 14A-14B depict another exemplary wafer cleaning method;

FIG. 19 depicts another exemplary wafer cleaning method;

FIGS. 23A-23C depict an exemplary voltage attenuation circuit for monitoring the sonic power supply operation status;

FIGS. 24A-24C depict an exemplary shaping circuit for monitoring the sonic power supply operation status;

DETAILED DESCRIPTION

Figure 1A:
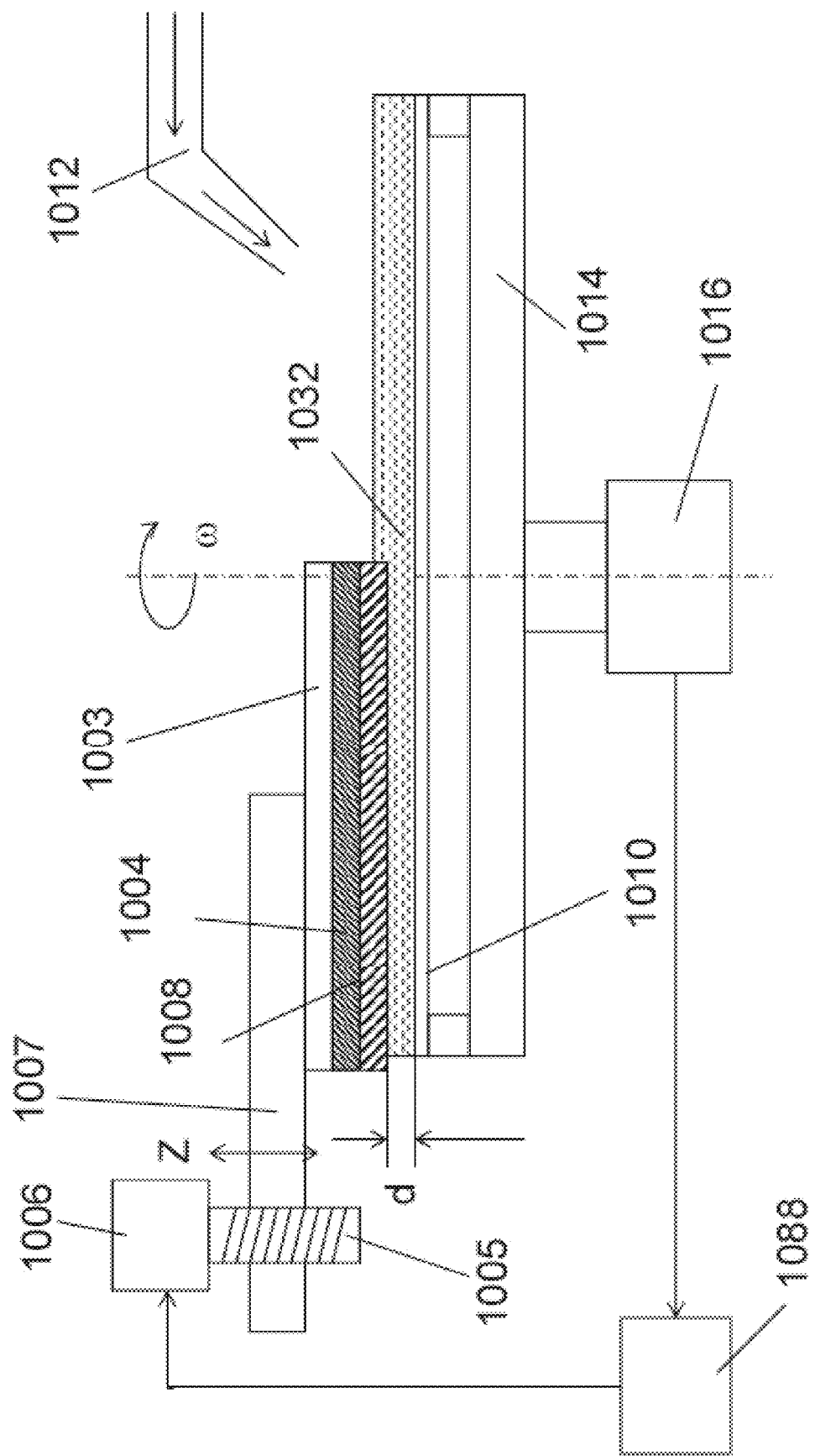
FIGS. 1A-1B depict an exemplary wafer cleaning apparatus using ultra or mega sonic device.
Figure 1B:
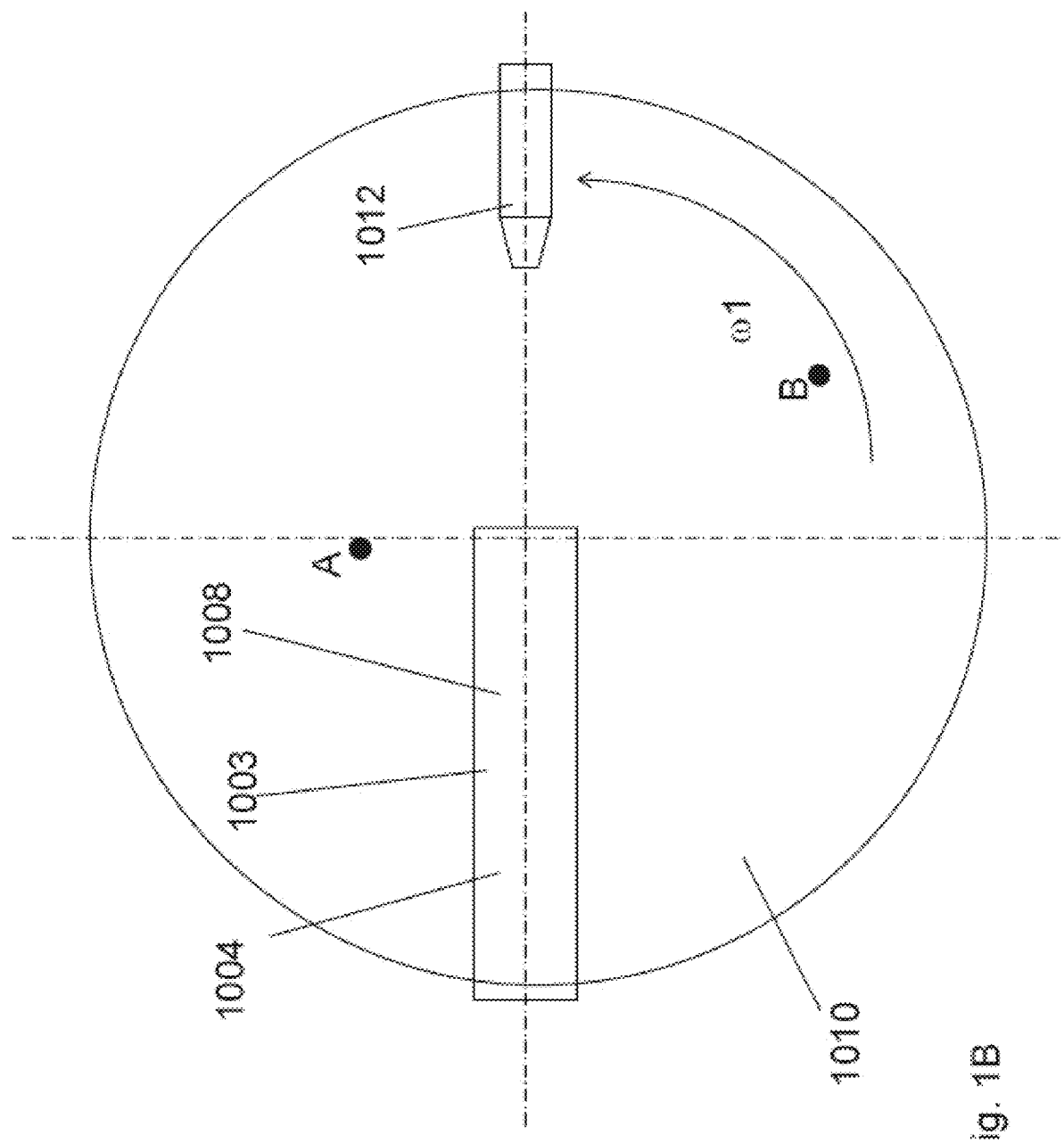

FIGS. 1A and 1B show an exemplary wafer cleaning apparatus using an ultra or mega sonic device. The wafer cleaning apparatus includes wafer 1010, wafer chuck 1014 being rotated by rotation driving mechanism 1016, nozzle 1012 delivering liquid, such as cleaning chemicals or de-ionized water 1032, ultra/mega sonic device 1003 and ultra/mega sonic power supply. The ultra/mega sonic device 1003 further includes piezoelectric transducer 1004 acoustically coupled to resonator 1008. The transducer 1004 is electrically excited such that it vibrates and the resonator 1008 transmits high frequency sound energy into the liquid. Bubble cavitation generated by the ultra/mega sonic energy oscillates particles on the wafer 1010. Contaminants are thus vibrated away from the surfaces of the wafer 1010, and removed from the surfaces of the wafer 1010 through the flowing liquid 1032 supplied by the nozzle 1012.

FIGS. 2A to 2G show a top view of ultra/mega sonic devices according to the present invention. The ultra/mega sonic device 1003 shown in FIGS. 1A and 1B can be replaced by different shape of ultra/mega sonic devices 2003, i.e. triangle or pie shape as shown in FIG. 2A, rectangle as shown in FIG. 2B, octagon as shown in FIG. 2C, elliptical as shown in FIG. 2D, half circle as shown in FIG. 2E, quarter circle as shown in FIG. 2F, and circle as shown in FIG. 2G.

Figure 3:
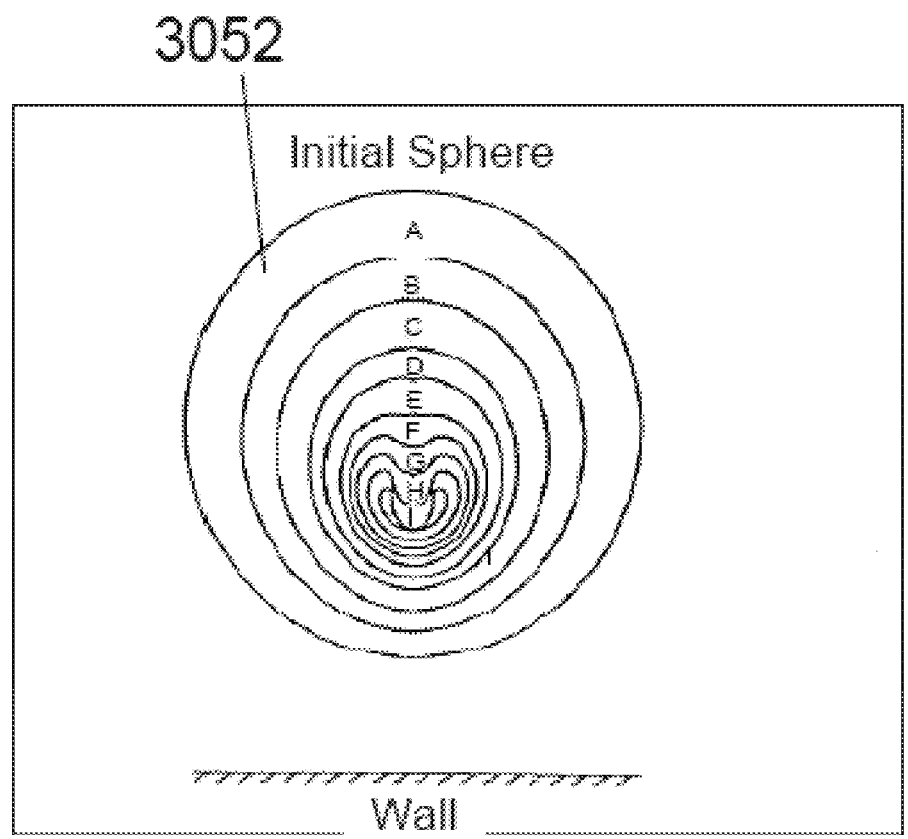
FIG. 3 depicts bubble cavitation during wafer cleaning process.
Figure 4A:
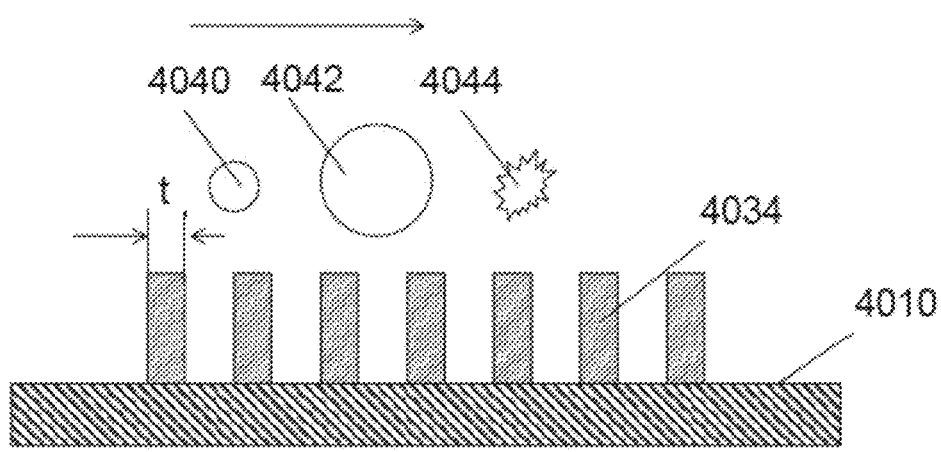
FIGS. 4A-4B depict a transit cavitation damaging patterned structure on a wafer during wafer cleaning process.
Figure 4B:
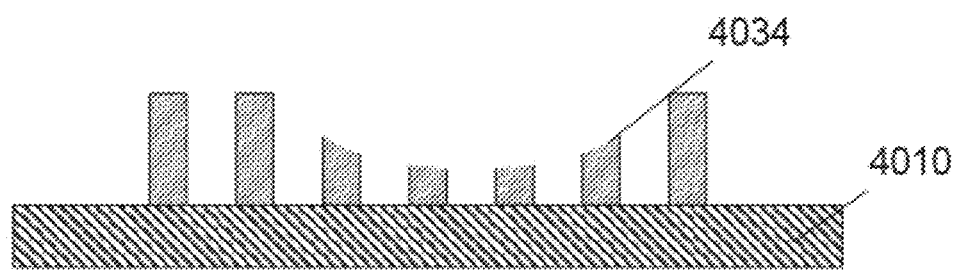

FIG. 3 shows a bubble cavitation during compression phase. The shape of bubble 3052 is gradually compressed from a spherical shape A to an apple shape G, finally the bubble 3052 reaches to an implosion status I and forms a micro jet. As shown in FIGS. 4A and 4B, the micro jet is very violent (can reach a few thousands atmospheric pressures and a few thousands ° C.), which can damage the fine patterned structure 4034 on the wafer 4010, especially when the feature size t shrinks to 70 nm and smaller.

FIGS. 5A to 5C show simplified model of bubble cavitation according to the present invention. As sonic positive pressure acting on the bubble, the bubble reduces its volume. During this volume shrinking process, the sonic pressure $P_M$ did a work to the bubble, and the mechanical work converts to thermal energy inside the bubble, therefore temperature of gas and/or vapor inside bubble increases.

The idea gas equation can be expressed as follows:

$$p_0 v_0/T_0 = pv/T \qquad (1)$$

where, $p_0$ is pressure inside bubble before compression, $v_0$ initial volume of bubble before compression, $T_0$ temperature of gas inside bubble before compression, p is pressure inside bubble in compression, v volume of bubble in compression, T temperature of gas inside bubble in compression.

In order to simplify the calculation, assuming the temperature of gas is no change during the compression or compression is very slow and temperature increase is cancelled by liquid surrounding the bubble. So that the mechanical work $w_m$ did by sonic pressure $P_M$ during one time of bubble compression (from volume N unit to volume 1 unit or compression ratio=N) can be expressed as follows:

$$w_m = \int_0^{x_0-1} pS\,dx = \int_0^{x_0-1} (S(x_0 p_0)/(x_0-x))\,dx = \\ Sx_0 p_0 \int_0^{x_0-1} dx/(x_0-x) = -Sx_0 p_0 \ln(x_0-x)\,|_0^{x_0-1} = Sx_0 p_0 \ln(x_0) \qquad (2)$$

Where, S is area of cross section of cylinder, x0 the length of the cylinder, p0 pressure of gas inside cylinder before compression. The equation (2) does not consider the factor of temperature increase during the compression, so that the actual pressure inside bubble will be higher due to temperature increase. Therefore the actual mechanical work conducted by sonic pressure will be larger than that calculated by equation (2).

If assuming all mechanical work did by sonic pressure is partially converted to thermal energy and partially converted mechanical energy of high pressure gas and vapor inside bubble, and such thermal energy is fully contributed to temperature increase of gas inside bubble (no energy transferred to liquid molecules surrounding the bubble), and assuming the mass of gas inside bubble staying constant before and after compression, then temperature increase $\Delta T$ after one time of compression of bubble can be expressed in the following formula:

$$\Delta T = Q/(mc) = \beta w_m/(mc) = \beta S x_0 p_0 \ln(x_0)/(mc) \qquad (3)$$

where, Q is thermal energy converted from mechanical work, β ratio of thermal energy to total mechanical works did by sonic pressure, m mass of gas inside the bubble, c gas specific heat coefficient. Substituting β=0.65, S=1E-12 m², $x_0$=1000 μm=1E-3 m (compression ratio N=1000), $p_0$=1 kg/cm²=1E4 kg/m², m=8.9E-17 kg for hydrogen gas, c=9.9E3 J/(kg ° k) into equation (3), then ΔT=50.9° C.

The temperature $T_1$ of gas inside bubble after first time compression can be calculated as:

$$T_1 = T_0 + \Delta T = 20°\,C. + 50.9°\,C. = 70.9°\,C. \qquad (4)$$

When the bubble reaches the minimum size of 1 micron as shown in FIG. 5B. At such a high temperature, of cause some liquid molecules surrounding bubble will evaporate. After then, the sonic pressure become negative and bubble starts to increase its size. In this reverse process, the hot gas and vapor with pressure $P_G$ will do work to the surrounding liquid surface. At the same time, the sonic pressure $P_M$ is pulling bubble to expansion direction as shown in FIG. 5C, therefore the negative sonic pressure $P_M$ also do partial work to the surrounding liquid too. As the results of the joint efforts, the thermal energy inside bubble cannot be fully released or converted to mechanical energy, therefore the temperature of gas inside bubble cannot cool down to original gas temperature $T_0$ or the liquid temperature. After the first cycle of cavitation finishes, the temperature $T_2$ of gas in bubble will be somewhere between $T_0$ and $T_1$ as shown in FIG. 6B. Or $T_2$ can be expressed as:

$$T_2 = T1 - \delta T = T_0 + \Delta T - \delta T \qquad (5)$$

Where δT is temperature decrease after one time of expansion of the bubble, and δT is smaller than ΔT.

When the second cycle of bubble cavitation reaches the minimum bubble size, the temperature T3 of gas and or vapor inside bubble will be:

$$T3 = T2 + \Delta T = T_0 + \Delta T - \delta T + \Delta T = T_0 + 2\Delta T - \delta T \qquad (6)$$

When the second cycle of bubble cavitation finishes, the temperature T4 of gas and/or vapor inside bubble will be:

$$T4 = T3 - \delta T = T_0 + 2\Delta T - \delta T - \delta T = T_0 + 2\Delta T - 2\delta T \qquad (7)$$

Similarly, when the nth cycle of bubble cavitation reaches the minimum bubble size, the temperature $T_{2n-1}$ of gas and or vapor inside bubble will be:

$$T_{2n-1} = T_0 + n\Delta T - (n-1)\delta T \qquad (8)$$

When the nth cycle of bubble cavitation finishes, the temperature $T_{2n}$ of gas and/or vapor inside bubble will be:

$$T_{2n} = T_0 + n\Delta T - n\delta T = T_0 + n(\Delta T - \delta T) \qquad (9)$$

As cycle number n of bubble cavitation increase, the temperature of gas and vapor will increase, therefore more molecules on bubble surface will evaporate into inside of bubble 6082 and size of bubble 6082 will increase too, as shown in FIG. 6C. Finally the temperature inside bubble during compression will reach implosion temperature $T_i$ (normally $T_i$ is as high as a few thousands ° C.), and violent micro jet 6080 forms as shown in FIG. 6C.

From equation (8), implosion cycle number $n_i$ can be written as following:

$$n_i = (T_i - T_0 - \Delta T)/(\Delta T - \delta T) + 1 \qquad (10)$$

From equation (10), implosion time $\tau_i$ can be written as following:

$$\tau_i = n_i t_1 = t_1((T_i - T_0 - \Delta T)/(\Delta T - \delta T) + 1) = \qquad (11)$$
$$n_i/f_1 = ((T_i - T_0 - \Delta T)/(\Delta T - \delta T) + 1)/f_1$$

Where, $t_1$ is cycle period, and $f_1$ frequency of ultra/mega sonic wave.

According to formulas (10) and (11), implosion cycle number $n_i$ and implosion time $\tau_i$ can be calculated. Table 1 shows calculated relationships among implosion cycle number $n_i$, implosion time $\tau_i$ and $(\Delta T - \delta T)$, assuming Ti=3000° C., $\Delta T$=50.9° C., $T_0$=20° C., $f_1$=500 KHz, $f_1$=1 MHz, and $f_1$=2 MHz.

TABLE 1

| $\Delta T - \delta T$ (° C.) | 0.1 | 1 | 10 | 30 | 50 |
|---|---|---|---|---|---|
| $n_i$ | 29018 | 2903 | 291 | 98 | 59 |
| $\tau_i$ (ms) $f_1$ = 500 KHz | 58.036 | 5.806 | 0.582 | 0.196 | 0.118 |
| $\tau_i$ (ms) $f_1$ = 1 MHz | 29.018 | 2.903 | 0.291 | 0.098 | 0.059 |
| $\tau_i$ (ms) $f_1$ = 2 MHz | 14.509 | 1.451 | 0.145 | 0.049 | 0.029 |

In order to avoid damage to patterned structure on wafer, a stable cavitation must be maintained, and the bubble implosion or micro jet must be avoided. FIGS. 7A to 7C show a method to achieve a damage free ultra or mega sonic cleaning on a wafer with patterned structure by maintaining a stable bubble cavitation according to the present invention. FIG. 7A shows waveform of power supply output, and FIG. 7B shows the temperature curve corresponding to each cycle of cavitation, and FIG. 7C shows the bubble size expansion during each cycle of cavitation. Operation process steps to avoid bubble implosion according to the present invention are disclosed as follows:

Step 1: Put ultra/mega sonic device adjacent to surface of wafer or substrate set on a chuck or tank;

Step 2: Fill chemical liquid or gas (hydrogen, nitrogen, oxygen, or $CO_2$) doped water between wafer and the ultra/mega sonic device;

Step 3: Rotate chuck or oscillate wafer;

Step 4: Set power supply at frequency $f_1$ and power $P_1$;

Step 5: Before temperature of gas and vapor inside bubble reaches implosion temperature $T_i$, (or time reaches $\tau_1 < \tau_i$ as being calculated by equation (11)), set power supply output to zero watts, therefore the temperature of gas inside bubble start to cool down since the temperature of liquid or water is much lower than gas temperature.

Step 6: After temperature of gas inside bubble decreases to room temperature $T_0$ or time (zero power time) reaches $\tau_2$, set power supply at frequency $f_1$ and power $P_1$ again.

Step 7: repeat Step 1 to Step 6 until wafer is cleaned.

In step 5, the time $\tau_1$ must be shorter than $\tau_i$ in order to avoid bubble implosion, and $\tau_i$ can be calculated by using equation (11).

In step 6, the temperature of gas inside bubble is not necessary to be cooled down to room temperature or liquid temperature; it can be certain temperature above room temperature or liquid temperature, but better to be significantly lower than implosion temperature $T_i$.

According to equations 8 and 9, if $(\Delta T - \delta T)$ can be known, the $\tau_i$ can be calculated. But in general, $(\Delta T - \delta T)$ is not easy to be calculated or measured directly. The following method can determine the implosion time $\tau_i$ experimentally.

Step 1: Based on Table 1, choosing 5 different time $\tau_1$ as design of experiment (DOE) conditions.

Step 2: choose time $\tau_2$ at least 10 times of $\tau_1$, better to be 100 times of $\tau_1$ at the first screen test.

Step 3: fix certain power $P_0$ to run above five conditions cleaning on specific patterned structure wafer separately. Here, $P_0$ is the power at which the patterned structures on wafer will be surely damaged when running on continuous mode (non-pulse mode).

Step 4: Inspect the damage status of above five wafers by SEMS or wafer pattern damage review tool such as AMAT SEM vision or Hitachi IS3000, and then the implosion time $\tau_i$ can be located in certain range.

Step 1 to step 4 can be repeated again to narrow down the range of implosion time $\tau_i$. After knowing the implosion time $\tau_i$, the time $\tau_1$ can be set at a value smaller than 0.5 $\tau_1$ for safety margin. One example of experimental data is described as following.

The patterned structures are 55 nm poly-silicon gate lines. Ultra/mega sonic wave frequency was 1 MHz, and ultra/mega sonic device manufactured by Prosys was used and operated in a gap oscillation mode (disclosed by PCT/CN2008/073471) for achieving better uniform energy dose within wafer and wafer to wafer. Other experimental parameters and final pattern damage data are summarized in Table 2 as follows:

TABLE 2

| Wafer ID | $CO_2$ conc. (18 µs/cm) | Process Time (sec) | Power Density (Watts/cm2) | Cycle Number | $\tau_1$ (ms) | $\tau_2$ (ms) | Number of Damage Sites |
|---|---|---|---|---|---|---|---|
| #1 | 18 | 60 | 0.1 | 2000 | 2 | 18 | 1216 |
| #2 | 18 | 60 | 0.1 | 100 | 0.1 | 0.9 | 0 |

It was clear that the $\tau_1$=2 ms (or 2000 cycle number) introduced as many as 1216 damage sites to patterned structure with 55 nm feature size, but that the $\tau_1$=0.1 ms (or 100 cycle number) introduced zero (0) damage sites to patterned structure with 55 nm feature size. So that the $\tau_1$ is some number between 0.1 ms and 2 ms, more detail tests need to be done to narrow its range. Obviously, the cycle number related to ultra or mega sonic power density and frequency, the larger the power density, the less the cycle number; and the lower the frequency, the less the cycle number. From above experimental results, we can predict that the damage-free cycle number should be smaller than 2,000, assuming the power density of ultra or mega sonic wave is larger than 0.1 watts or $cm^2$, and frequency of ultra or mega sonic wave is equal to or less than 1 MHz. If the frequency increases to a range larger than 1 MHz or power density is less than than 0.1 watts/$cm^2$, it can be predicted that the cycle number will increase.

After knowing the time $\tau_1$, then the time $\tau_2$ can be shorten based on similar DEO method described above, i.e. fix time $\tau_1$, gradually shorten the time $\tau_2$ to run DOE till damage on patterned structure being observed. As the time $\tau_2$ is shorten, the temperature of gas and or vapor inside bubble cannot be cooled down enough, which will gradually shift average temperature of gas and vapor inside bubble up, eventually it will trigger implosion of bubble. This trigger time is called critical cooling time. After knowing critical cooling time $\tau_c$, the time $\tau_2$ can be set at value larger than $2\tau_c$ for the same reason to gain safety margin.

Figure 8A:
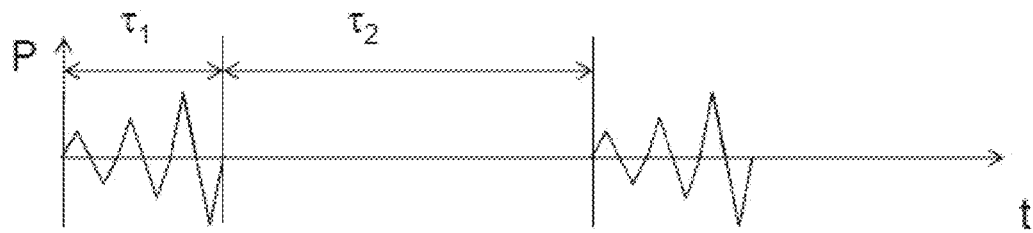
FIGS. 8A-8D depict another exemplary wafer cleaning method.
Figure 8B:
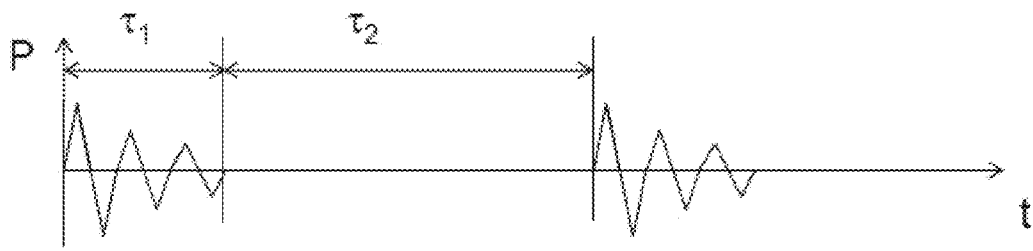
Figure 8C:
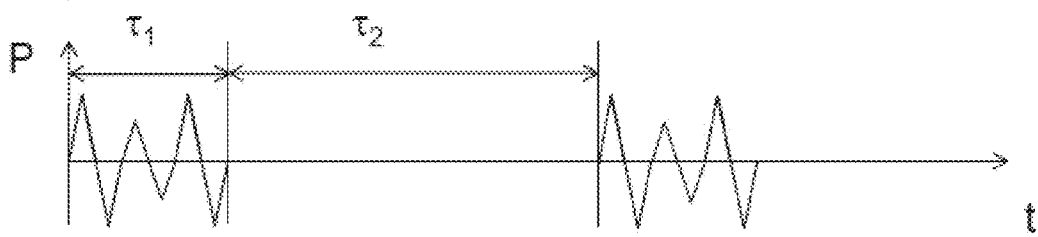
Figure 8D:
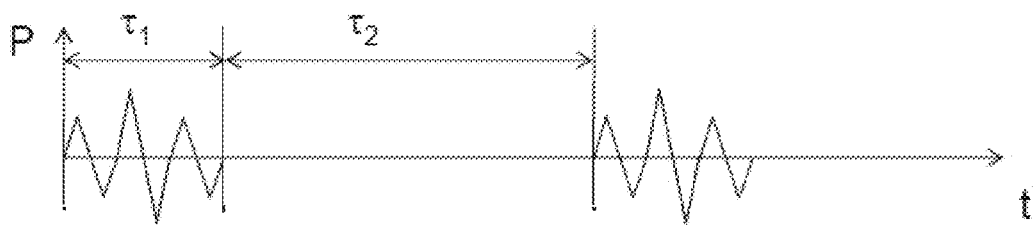

FIGS. 8A to 8D show another embodiment of wafer cleaning method using an ultra/mega sonic device according to the present invention. The method is similar to that shown in FIG. 7A, except in step 4 setting ultra/mega sonic power supply at frequency $f_1$ and power with changing amplitude of waveform. FIG. 8A shows another wafer cleaning method of setting ultra/mega sonic power supply at frequency $f_1$ and power with increasing amplitude of waveform in step 4. FIG. 8B shows another wafer cleaning method of setting ultra/mega sonic power supply at frequency $f_1$ and power with decreasing amplitude of waveform in step 4. FIG. 8C shows another wafer cleaning method of setting ultra/mega sonic power supply at frequency $f_1$ and power with decreasing first and increasing later amplitude of waveform in step 4. FIG. 8D shows another wafer cleaning method of setting ultra/mega sonic power supply at frequency $f_1$ and power with increasing first and decreasing later amplitude of waveform in step 4.

Figure 9A:
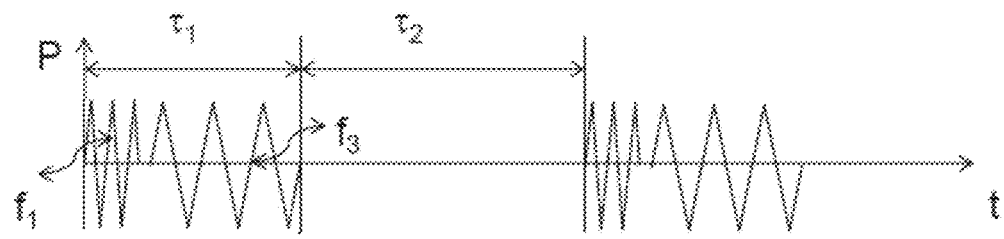
FIGS. 9A-9D depict another exemplary wafer cleaning method.
Figure 9B:
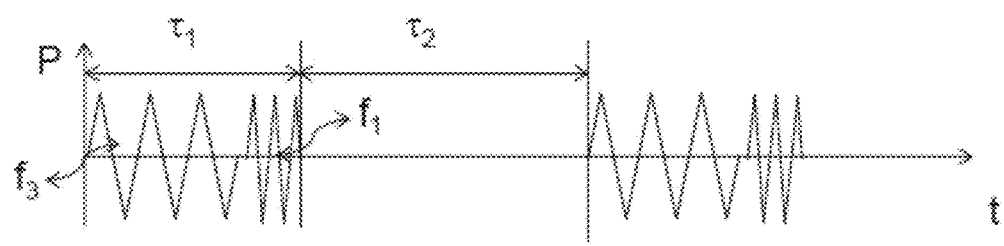
Figure 9C:
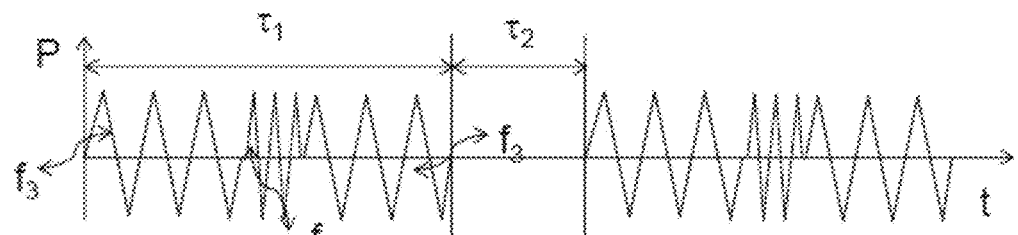
Figure 9D:
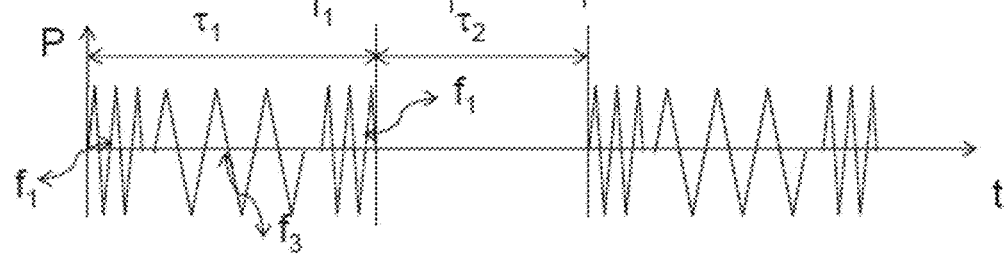

FIGS. 9A to 9D show another embodiment of wafer cleaning method using an ultra/mega sonic device according to the present invention. The method is similar to that shown in FIG. 7A, except in step 4 setting ultra/mega sonic power supply at changing frequency. FIG. 9A shows another wafer cleaning method of setting ultra/mega sonic power supply at frequency $f_1$ first then frequency $f_3$ later, $f_1$ is higher than $f_3$ in step 4. FIG. 9B shows another wafer cleaning method of setting ultra/mega sonic power supply at frequency $f_3$ first then frequency $f_1$ later, $f_1$ is higher than $f_3$ in step 4. FIG. 9C shows another wafer cleaning method of setting ultra/mega sonic power supply at frequency $f_3$ first, frequency $f_1$ later and frequency $f_3$ last, $f_1$ is higher than $f_3$ in step 4. FIG. 9D shows another wafer cleaning method of setting ultra/mega sonic power supply at frequency $f_1$ first, frequency $f_3$ later and frequency $f_1$ last, $f_1$ is higher than $f_3$ in step 4.

Similar to method shown in FIG. 9C, the ultra/mega sonic power supply can be set at frequency $f_1$ first, at frequency $f_3$ later and at frequency $f_4$ at last in step 4, where $f_4$ is smaller than $f_3$, and $f_3$ is smaller than $f_1$.

Again similar to method shown in FIG. 9C, the ultra/mega sonic power supply can be set at frequency $f_4$ first, at frequency $f_3$ later and at frequency $f_1$ at last in step 4, where $f_4$ is smaller than $f_3$, and $f_3$ is smaller than $f_1$.

Again similar to method shown in FIG. 9C, the ultra/mega sonic power supply can be set at frequency $f_1$ first, at frequency $f_4$ later and at frequency $f_3$ at last in step 4, where $f_4$ is smaller than $f_3$, and $f_3$ is smaller than $f_1$.

Again similar to method shown in FIG. 9C, the ultra/mega sonic power supply can be set at frequency $f_3$ first, at frequency $f_4$ later and at frequency $f_1$ at last in step 4, where $f_4$ is smaller than $f_3$, and $f_3$ is smaller than $f_1$.

Again similar to method shown in FIG. 9C, the ultra/mega sonic power supply can be set at frequency $f_3$ first, at frequency $f_1$ later and at frequency $f_4$ at last in step 4, where $f_4$ is smaller than $f_3$, and $f_3$ is smaller than $f_1$.

Again similar to method shown in FIG. 9C, the ultra/mega sonic power supply can be set at frequency $f_4$ first, at frequency $f_1$ later and at frequency $f_3$ at last in step 4, where $f_4$ is smaller than $f_3$, and $f_3$ is smaller than $f_1$.

FIGS. 10A to 10B show another method to achieve a damage free ultra/mega sonic cleaning on a wafer with patterned structure by maintaining a stable bubble cavitation according to the present invention. FIG. 10A shows waveform of the power supply outputs, and FIG. 10B shows the temperature curve corresponding to each cycle of cavitation. Operation process steps according to the present invention are disclosed as follows:

Step 1: Put an ultra/mega sonic device adjacent to surface of wafer or substrate set on a chuck or tank;

Step 2: Fill chemical liquid or gas doped water between wafer and the ultra/mega sonic device;

Step 3: Rotate chuck or oscillate wafer;

Step 4: Set power supply at frequency $f_1$ and power $P_1$;

Step 5: Before temperature of gas and vapor inside bubble reaches implosion temperature $T_i$, (total time $\tau_1$ elapse), set power supply output at frequency $f_1$ and power $P_2$, and $P_2$ is smaller than $P_1$. Therefore the temperature of gas inside bubble start to cool down since the temperature of liquid or water is much lower than gas temperature.

Step 6: After temperature of gas inside bubble decreases to certain temperature close to room temperature $T_0$ or time (zero power time) reach $\tau_2$, set power supply at frequency $f_1$ and power $P_1$ again.

Step 7: repeat Step 1 to Step 6 until wafer is cleaned.

In step 6, the temperature of gas inside bubble can not be cooled down to room temperature due to power $P_2$, there should be a temperature difference $\Delta T_2$ existing in later stage of $\tau_2$ time zone, as shown in FIG. 10B.

FIGS. 11A to 11B show another embodiment of wafer cleaning method using an ultra/mega sonic device according to the present invention. The method is similar to that shown in FIG. 10A, except in step 5 setting ultra/mega sonic power supply at frequency $f_2$ and power $P_2$, where $f_2$ is lower than $f_1$ and $P_2$ is less than $P_1$. Since $f_2$ is lower than $f_1$, the temperature of gas or vapor inside bubble increasing faster, therefore the P2 should be set significantly less than P1, better to be 5 or 10 times less in order to reduce temperature of gas and or vapor inside bubble.

FIGS. 12A to 12B show another embodiment of wafer cleaning method using an ultra/mega sonic device according to the present invention. The method is similar to that shown in FIG. 10A, except in step 5 setting ultra/mega sonic power supply at frequency $f_2$ and power $P_2$, where $f_2$ is higher than $f_1$, and $P_2$ is equal to $P_1$.

FIGS. 13A to 13B show another embodiment of wafer cleaning method using an ultra/mega sonic device according to the present invention. The method is similar to that shown in FIG. 10A, except in step 5 setting ultra/mega sonic power supply at frequency $f_2$ and power $P_2$, where $f_2$ is higher than $f_1$, and $P_2$ is less than $P_1$.

FIGS. 14A to 14B show another embodiment of wafer cleaning method using an ultra/mega sonic device according to the present invention. The method is similar to that shown in FIG. 10A, except in step 5 setting ultra/mega sonic power supply at frequency $f_2$ and power $P_2$, where $f_2$ is higher than $f_1$, and $P_2$ is higher than $P_1$. Since $f_2$ is higher than $f_1$, the temperature of gas or vapor inside bubble increasing slower, therefore the P2 can be slightly higher than P1, but must make sure the temperature of gas and vapor inside bubbler decreases in time zone $\tau_2$ comparing to temperature zone $\tau_1$, as shown in FIG. 14B.

Figure 15A:
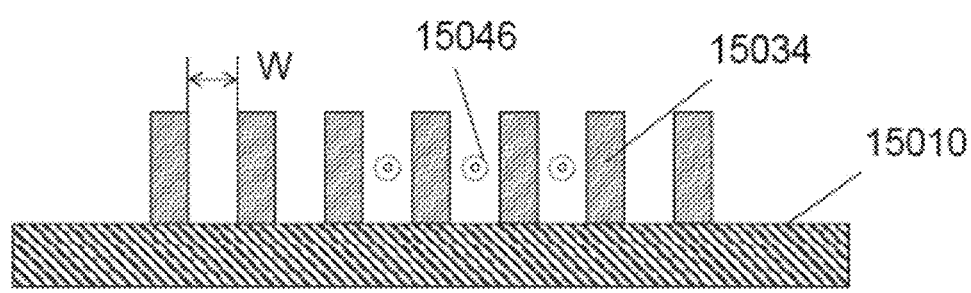
FIGS. 15A-15C depict a stable cavitation damaging patterned structure on a wafer during wafer cleaning process.
Figure 15B:
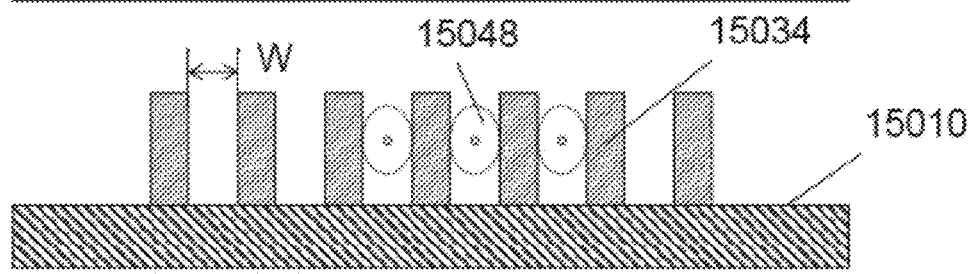
Figure 15C:
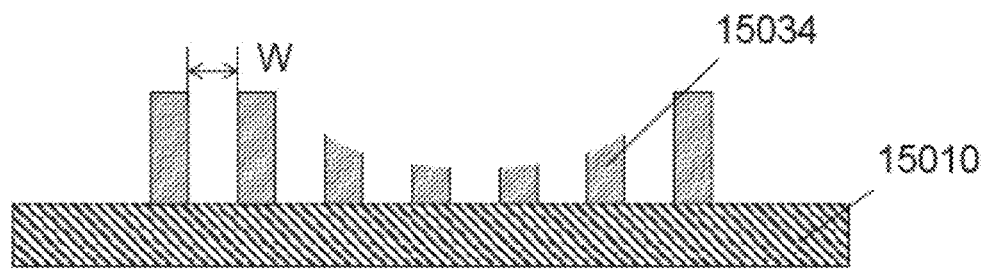

FIGS. 4A and 4B show that patterned structure is damaged by the violent micro jet. FIGS. 15A and 15B show that the stable cavitation can also damage the patterned structure on wafer. As bubble cavitation continues, the temperature of gas and vapor inside bubble increases, therefore size of bubble 15046 also increases as shown in FIG. 15A. When size of bubble 15048 becomes larger than dimension of space W in patterned structure on wafer 15010 as shown in FIG. 15B, the expansion force of bubble cavitation can damage the patterned structure 15034 as shown in FIG. 15C. Another cleaning method according to the present invention is disclosed as follows:

Step 1: Put an ultra/mega sonic device adjacent to surface of wafer or substrate set on a chuck or tank;

Step 2: Fill chemical liquid or gas doped water between wafer and the ultra/mega sonic device;

Step 3: Rotate chuck or oscillate wafer;

Step 4: Set power supply at frequency $f_1$ and power $P_1$;

Step 5: Before size of bubble reaches the same dimension of space W in patterned structures (time $\tau_1$ elapse), set power supply output to zero watts, therefore the temperature of gas inside bubble starts to cool down since the temperature of liquid or water is much lower than gas temperature;

Step 6: After temperature of gas inside bubble continues to reduce either it reaches room temperature $T_0$ or time (zero power time) reach $\tau_2$, set power supply at frequency $f_1$ and power $P_1$ again;

Step 7: repeat Step 1 to Step 6 until wafer is cleaned.

In step 6, the temperature of gas inside bubble is not necessary to be cooled down to room temperature, it can be any temperature, but better to be significantly lower than implosion temperature $T_i$. In the step 5, bubble size can be slightly larger than dimension of patterned structures as long as bubble expansion force does not break or damage the patterned structure. The time $\tau_1$ can be determined experimentally by using the following method:

Step 1: Similar to Table 1, choosing 5 different time $\tau_1$ as design of experiment (DOE) conditions, Step 2: choose time $\tau_2$ at least 10 times of $\tau_1$, better to be 100 times of $\tau_1$ at the first screen test;

Step 3: fix certain power $P_0$ to run above five conditions cleaning on specific patterned structure wafer separately. Here, $P_0$ is the power at which the patterned structures on wafer will be surely damaged when running on continuous mode (non-pulser mode).

Step 4: Inspect the damage status of above five wafers by SEMS or wafer pattern damage review tool such as AMAT SEM vision or Hitachi IS3000, and then the damage time $\tau_i$ can be located in certain range.

Step 1 to step 4 can be repeated again to narrow down the range of damage time $\tau_d$. After knowing the damage time $\tau_d$, the time $\tau_1$ can be set at a value smaller than $0.5\ \tau_d$ for safety margin.

All cleaning methods described from FIG. 7 to FIG. 14 can be applied in or combined with the method described in FIG. 15.

Figure 16:
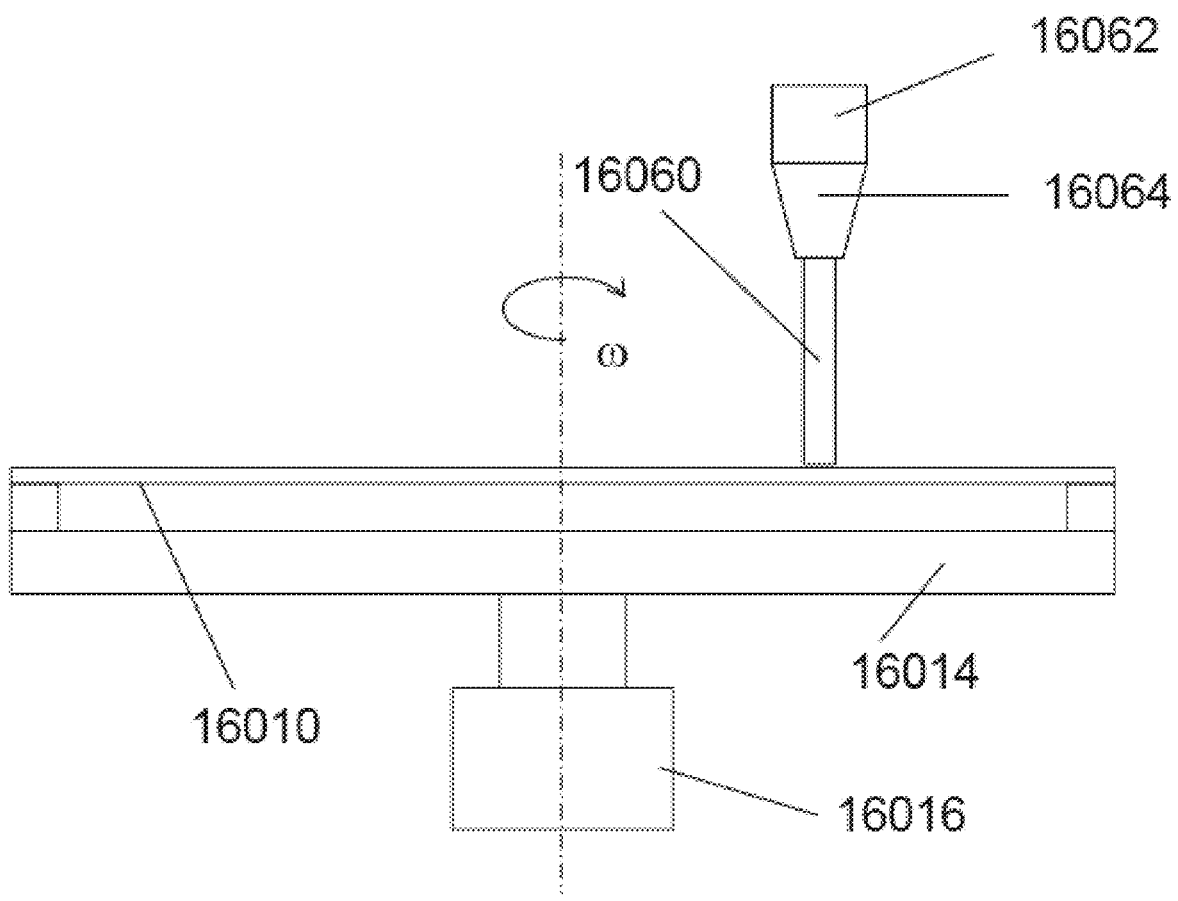
FIG. 16 depicts another exemplary wafer cleaning apparatus using ultra or mega sonic device.

FIG. 16 shows a wafer cleaning apparatus using an ultra/mega sonic device. The wafer cleaning apparatus includes wafer 16010, wafer chuck 16014 being rotated by rotation driving mechanism 16016, nozzle 16064 delivering cleaning chemicals or de-ionized water 16060, ultra/mega sonic device 16062 coupled with nozzle 16064, and ultra/mega sonic power supply. Ultra/mega sonic wave generated by ultra/mega sonic device 16062 is transferred to wafer through chemical or water liquid column 16060. All cleaning methods described from FIG. 7 to FIG. 15 can be used in cleaning apparatus described in FIG. 16.

Figure 17:
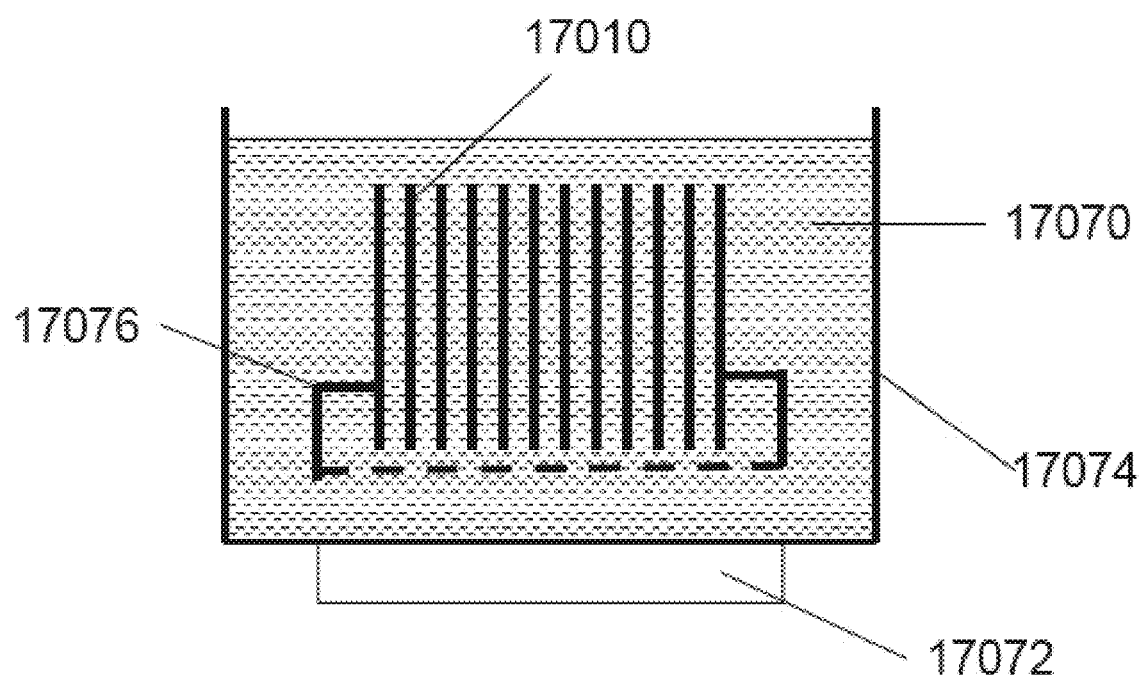
FIG. 17 depicts an exemplary wafer cleaning apparatus using ultra or mega sonic device.

FIG. 17 shows a wafer cleaning apparatus using an ultra/mega sonic device. The wafer cleaning apparatus includes wafers 17010, a cleaning tank 17074, a wafer cassette 17076 holding the wafers 17010 and being held in the cleaning tank 17074, cleaning chemicals 17070, an ultra/mega sonic device 17072 attached to outside wall of the cleaning tank 17074, and an ultra/mega sonic power supply. At least one inlet fills the cleaning chemicals 17070 into the cleaning tank 17074 to immerse the wafers 17010. All cleaning methods described from FIG. 7 to FIG. 15 can be used in cleaning apparatus described in FIG. 17.

Figure 18A:
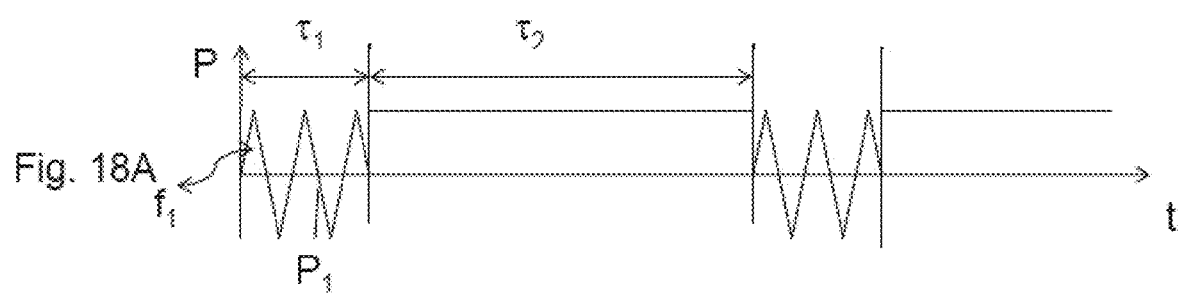
FIGS. 18A-18C depict another exemplary wafer cleaning method.
Figure 18B:
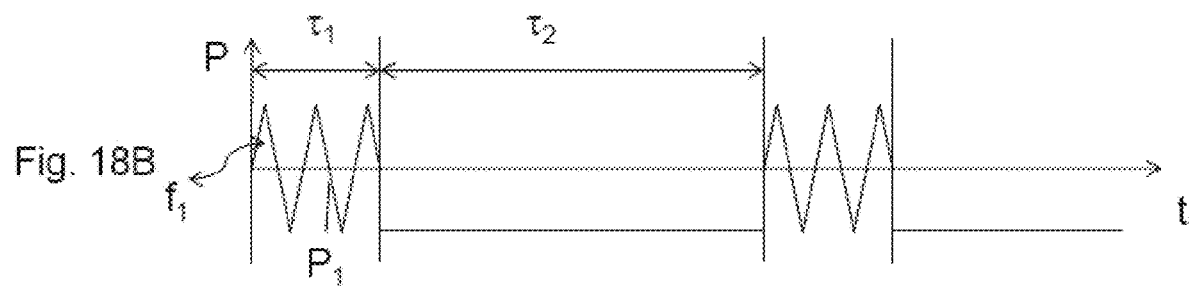
Figure 18C:
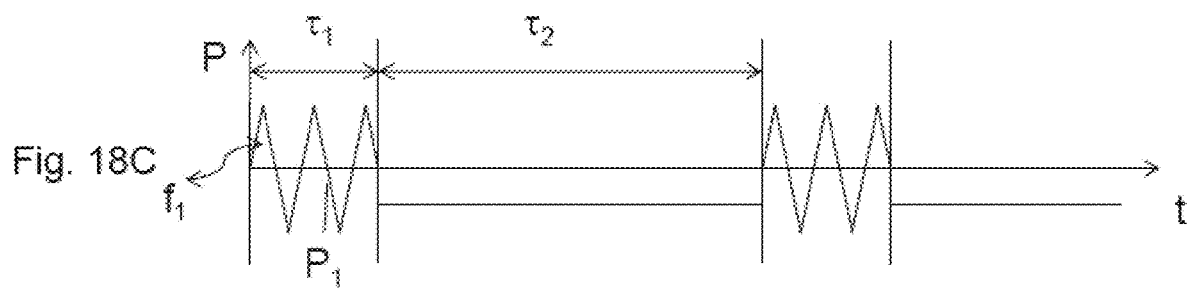

FIGS. 18A to 18C show another embodiment of wafer cleaning method using an ultra/mega sonic device according to the present invention. The method is similar to that shown in FIG. 7A, except in Step 5: Before temperature of gas and vapor inside bubble reaches implosion temperature $T_i$, (or time reach $\tau_1 < \tau_i$ as being calculated by equation (11)), set power supply output to a positive value or negative DC value to hold or stop ultra/mega sonic device to vibrate, therefore the temperature of gas inside bubble start to cool down since the temperature of liquid or water is much lower than gas temperature. The positive value of negative value can be bigger, equal to or smaller than power $P_1$.

FIG. 19 shows another embodiment of wafer cleaning method using an ultra/mega sonic device according to the present invention. The method is similar to that shown in FIG. 7A, except in Step 5: Before temperature of gas and vapor inside bubble reaches implosion temperature $T_i$, (or time reach $\tau_1 < \tau_i$ as being calculated by equation (11)), set power supply output at the frequency same as $f_1$ with reverse phase to $f_1$ to quickly stop the cavitation of bubble. Therefore the temperature of gas inside bubble start to cool down since the temperature of liquid or water is much lower than gas temperature. The positive value of negative value can be bigger, equal or less than power $P_1$. During above operation, the power supply output can be set at a frequency different from frequency $f_1$ with reverse phase to $f_1$ in order to quickly stop the cavitation of bubble.

Generally speaking, an ultra/mega sonic wave with the frequency between 0.1 MHz~10 MHz may be applied to the method disclosed in the present invention.

In the above embodiments, all the critical process parameters of sonic power supply, such as power, frequency, power on time ($\tau_1$) and power off time ($\tau_2$) are preset in a power supply controller, but no real-time monitoring was provided during the wafer cleaning process. Patterned structure damage cannot be avoided if the sonic power supply operation abnormal occurs during the wafer cleaning process. Hence, there needs an apparatus and method for real-time monitoring the sonic power supply operation status. If the parameters are not in the normal range, the sonic power supply should be shut down and an alarm signal should be sent out and reported.

Figure 20:
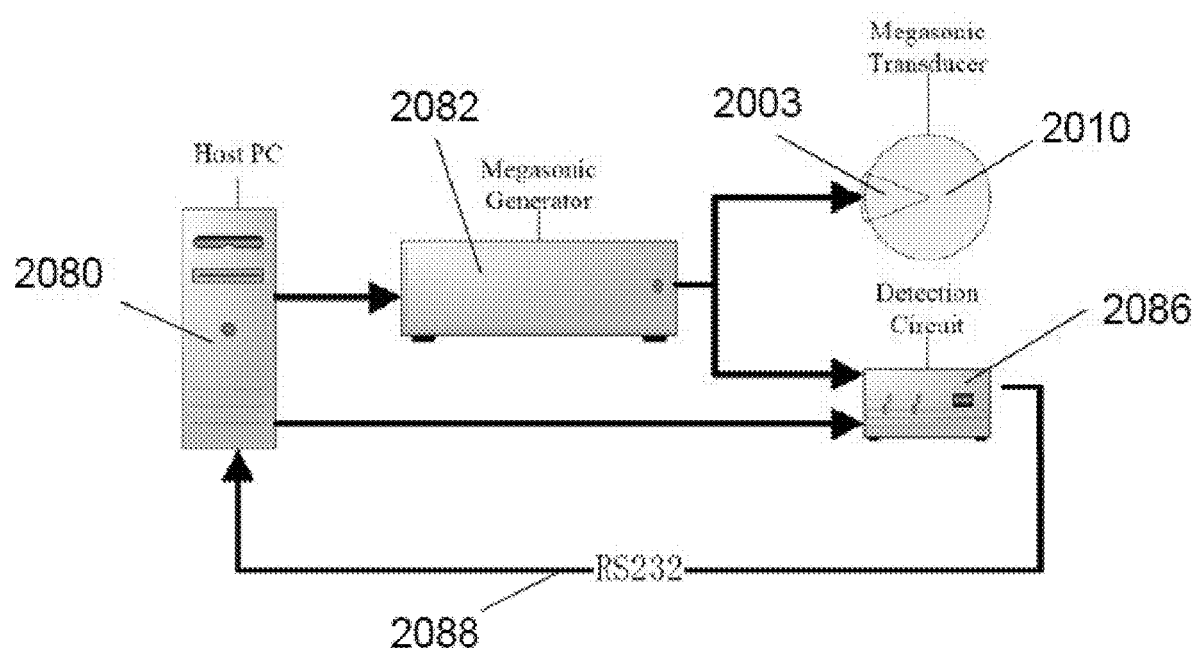
FIG. 20 depicts an exemplary control system for monitoring the sonic power supply operation status.

FIG. 20 shows an exemplary control system with a detection system for monitoring operation parameters of the sonic power supply during wafer cleaning process using an ultra/mega sonic device according to the present invention. The exemplary control system includes a host computer 2080, a sonic power supply 2082, a sonic transducer 2003, a detection system 2086, and a communication cable 2088. The host computer 2080 sends sonic parameter settings, such as power setting $P_1$, power on time setting $\tau_1$, power setting $P_2$, power off time setting $\tau_2$, and frequency setting, and control commands, for example, power enable command, to the sonic power supply 2082. The sonic power supply 2082 generates sonic waveforms after receiving these commands and sends the sonic waveforms to the sonic transducer 2003 for cleaning the wafer 2010. Meanwhile, the parameter settings sent by the host computer 2080 and actual sonic power supply 2082 outputs are read by the detection system 2086. The detection system 2086 compares the actual outputs from the sonic power supply 2082 with the parameter settings sent by the host computer 2080, and then sends the comparison results to the host computer 2080 through the communication cable 2088. If the actual outputs from the sonic power supply 2082 are different from the parameter settings sent by the host computer 2080, the detection system 2086 sends an alarm signal to the host computer 2080. The host computer 2080 receives the alarm signal and shuts down the sonic power supply 2082 to prevent further damage to the patterned structures on the wafer 2010.

Figure 21:
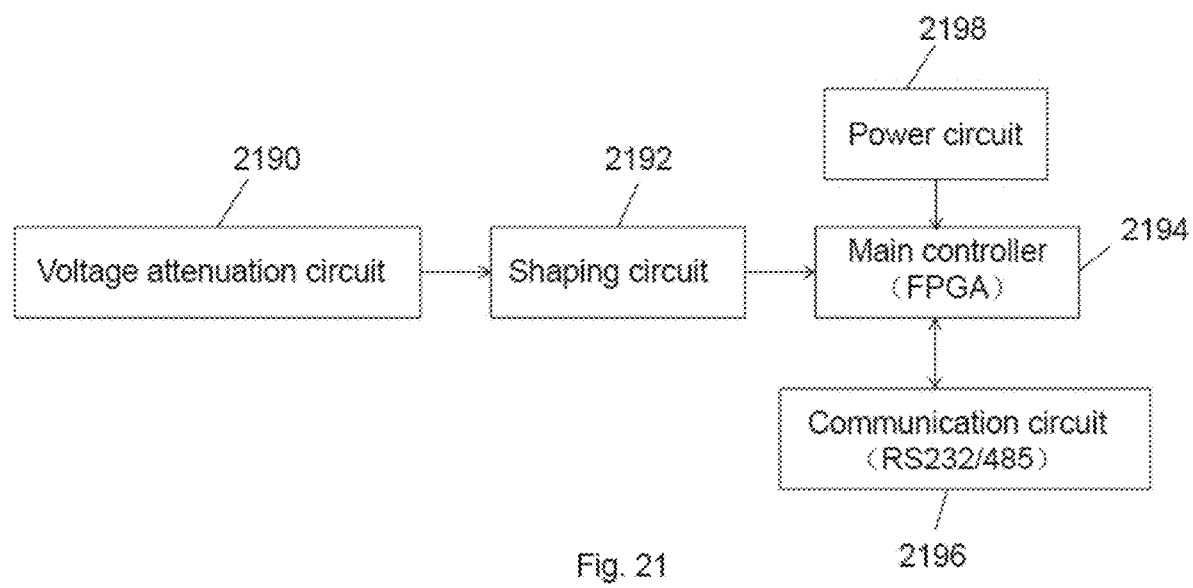
FIG. 21 depicts one exemplary detection system for monitoring the sonic power supply operation status.

FIG. 21 shows one exemplary detection system for monitoring operation parameters of the sonic power supply during wafer cleaning process using an ultra/mega sonic device according to the present invention. The detection system includes a voltage attenuation circuit 2190, a shaping circuit 2192, a main controller (FPGA) 2194, a communication circuit (RS 232/485) 2196 and a power circuit 2198.

FIGS. 23A to 23C show an exemplary voltage attenuation circuit of the present invention. When a sonic signal output from the sonic power supply 2082 is first read in, it has relatively high amplitude value, as shown in FIG. 23B. The voltage attenuation circuit 2190 is designed to use two operational amplifiers 23102 and 23104 to reduce the amplitude value of the waveform as shown in FIG. 23C. The attenuation rate of the voltage attenuation circuit 2190 is set in the range of 5 to 100, preferred 20. The voltage attenuation can be expressed in the following formula:

$$V_{out}=(R_2/R_1)*V_{in}$$

Assuming $R_1=200k, R_2=R_3=R_4=10K, V_{out}=(R_2/R_1)*V_{in}=V_{in}/20$

Where $V_{out}$ is amplitude value output by the voltage attenuation circuit 2190, $V_{in}$ is amplitude value input to the voltage attenuation circuit 2190, $R_1$, $R_2$, $R_3$, $R_4$ are resistances of the two operational amplifiers 23102 and 23104.

The output of the voltage attenuation circuit 2190 connects to the shaping circuit 2192. The waveform output from the voltage attenuation circuit 2190 is input to the shaping circuit 2192 to convert sinusoidal wave into square wave which can be dealt with by the main controller (FPGA) 2194. FIGS. 24A to 24C show an embodiment of the shaping circuit according to the present invention. As shown in FIG. 24A, the shaping circuit 2192 includes a window comparator 24102 and an OR gate 24104. When $V_{cal-}<V_{in}<V_{cal+}$, $V_{out}=0$, else $V_{out}=1$, where $V_{cal-}$ and $V_{cal+}$ are two threshold values, $V_{in}$ is the input value of the shaping circuit, $V_{out}$ is the output value of the shaping circuit. After the waveform passing the voltage attenuation circuit 2190, the waveform (sinusoidal wave) is input to the shaping circuit 2192. The shaping circuit 2192 converts the sinusoidal wave into square wave as shown in FIG. 24C.

Figure 25A:
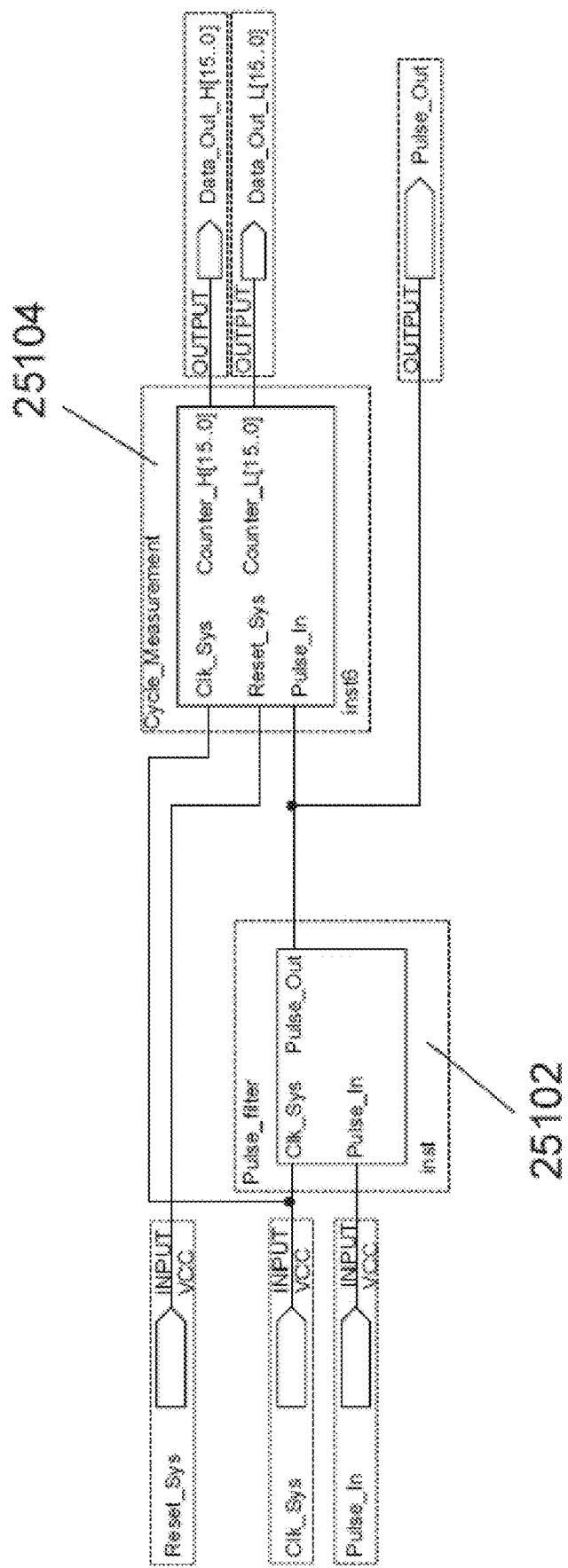
FIGS. 25A-25C depict an exemplary main controller for monitoring the sonic power supply operation status.
Figures 25B, 25C:
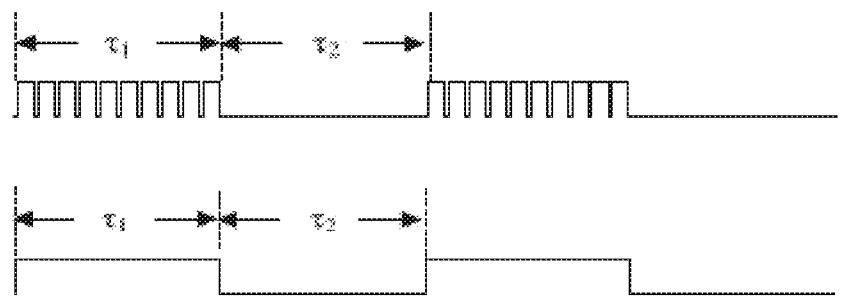

The square wave output from the shaping circuit 2192 is input to the main controller (FPGA) 2194. FIGS. 25A to 25C show an embodiment of the main controller (FPGA) of the present invention. As shown in FIG. 25A, the main controller (FPGA) 2194 includes a pulse conversion module 25102 and a periodic measurement module 25104. The pulse conversion module 25102 is used to convert the pulse signal of $\tau_1$ time to the high level signal, and the low level signal of $\tau_2$ time remains the same, as shown in FIGS. 25B and 25C. Circuit symbols of the pulse conversion module 25102 are shown in FIG. 25A, where Clk_Sys is 50 MHz clock signal, Pulse_In is the input signal, Pulse_Out is the output signal. The periodic measurement module 25104 is used to measure the time of high level and low level by means of counter. Circuit symbols of the periodic measurement module 25104 are shown in FIG. 25A, where Clk_Sys is 50 MHz clock signal, Pulse_In is the input signal, Pulse_Out is the output signal.

$\tau_1$=Counter_$H$*20 ns, $\tau_2$=Counter_$L$*20 ns.

Where Counter_H is the number of high level, Counter_L is the number of low level.

The main controller (FPGA) 2194 compares the calculated power on time with a preset time $\tau_1$, if the calculated power on time is longer than the preset time $\tau_1$, the main controller (FPGA) 2194 sends out an alarm signal to the host computer 2080 and the host computer 2080 receives the alarm signal and shuts down the sonic power supply 2082. The main controller (FPGA) 2194 compares the calculated power off time with a preset time $\tau_2$, if the calculated power off time is shorter than the preset time $\tau_2$, the main controller (FPGA) 2194 sends out an alarm signal to the host computer 2080 and the host computer 2080 receives the alarm signal and shuts down the sonic power supply 2082. The model of the main controller (FPGA) 2194 can select Altera Cyclone IV EP4CE22F17C6N.

Figure 26:
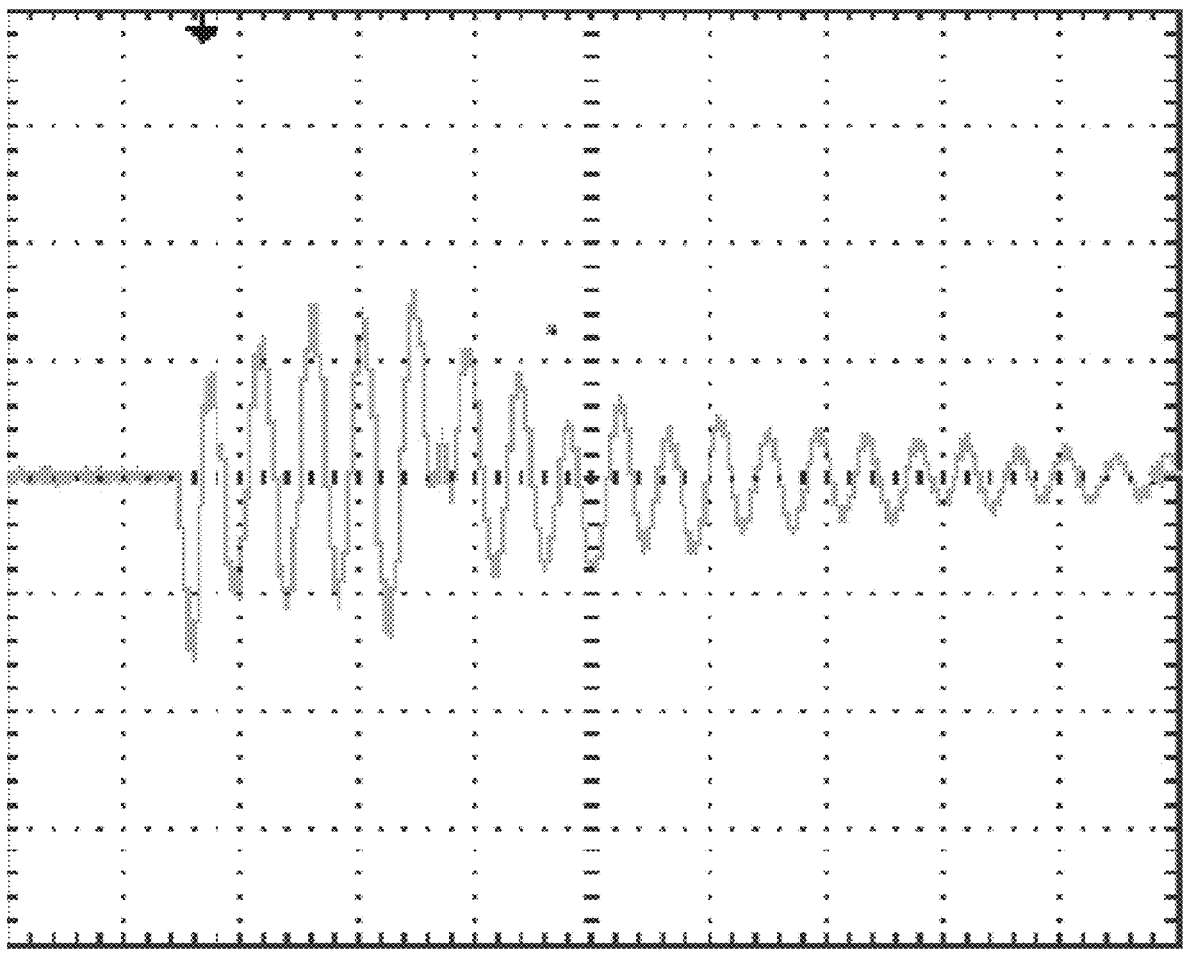
FIG. 26 depicts the sonic power supply still oscillates several periods after the host computer shuts down the sonic power supply.

As shown in FIG. 26, due to characteristics of apparatus itself, the sonic power supply 2082 still oscillates several periods after the host computer 2080 shuts down the sonic power supply 2082. The time $\tau_3$ of the several periods is also measured by the main controller (FPGA) 2194. The time $\tau_3$ can be obtained by experiments. Therefore, the actual power on time is equal to $\tau-\tau_3$, where $\tau$ is the time calculated by the periodic measurement module 25104, $\tau_3$ is the time of the sonic power supply 2082 oscillating several periods after the host computer 2080 shuts down the sonic power supply 2082. The main controller (FPGA) 2194 compares the actual power on time with a preset time $\tau_1$, if the actual power on time is longer than the preset time $\tau_1$, the main controller (FPGA) 2194 sends out an alarm signal to the host computer 2080.

As shown in FIG. 21, the communication circuit 2196 is established as an interface to the host computer 2080. The communication circuit 2196 realizes RS232/RS485 serial communication with the host computer 2080 to read parameter settings from the host computer 2080 and send comparison results to the host computer 2080.

As shown in FIG. 21, in order to provide DC1.2V, DC3.3V and DC5V for the whole system, the power circuit 2198 is designed to convert DC15V to the target voltage.

Figure 22:
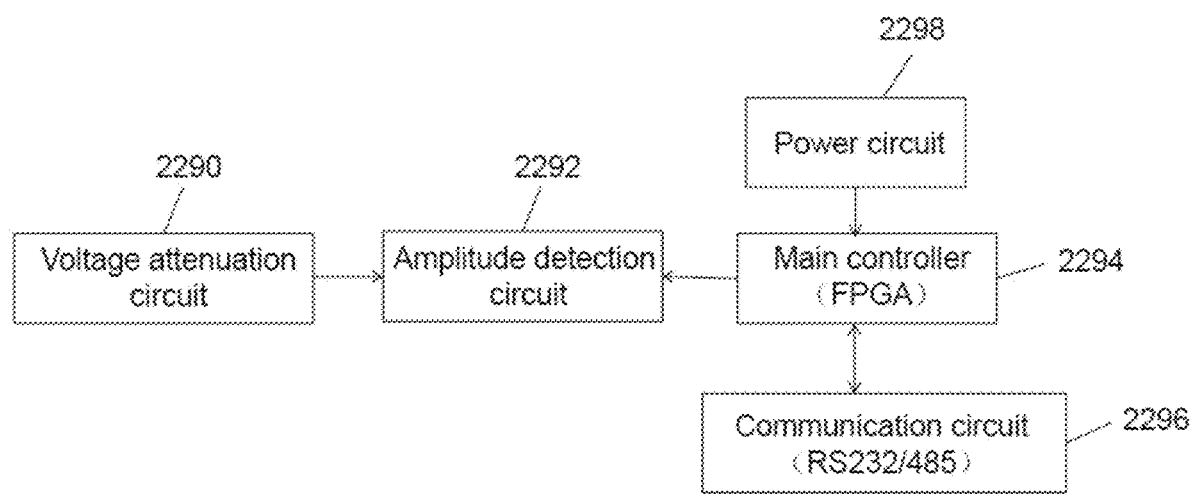
FIG. 22 depicts another exemplary detection system for monitoring the sonic power supply operation status.

FIG. 22 shows another exemplary detection system for monitoring operation parameters of the sonic power supply during wafer cleaning process using an ultra/mega sonic device according to the present invention. The detection system includes a voltage attenuation circuit 2290, an amplitude detection circuit 2292, a main controller (FPGA) 2294, a communication circuit (RS 232/485) 2296 and a power circuit 2298.

FIGS. 23A to 23C show an exemplary voltage attenuation circuit of the present invention. When a sonic signal output from the sonic power supply 2082 is first read in, it has relatively high amplitude value, as shown in FIG. 23B. The voltage attenuation circuit 2290 is designed to use two operational amplifiers 23102 and 23104 to reduce the amplitude value of the waveform as shown in FIG. 23C. The attenuation rate of the voltage attenuation circuit 2290 is set in the range of 5 to 100, preferred 20.

Figure 27A:
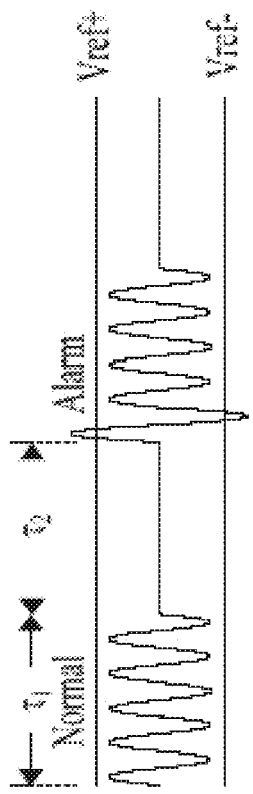
FIGS. 27A-27C depict an exemplary amplitude detection circuit for monitoring the sonic power supply operation status.
Figure 27B:
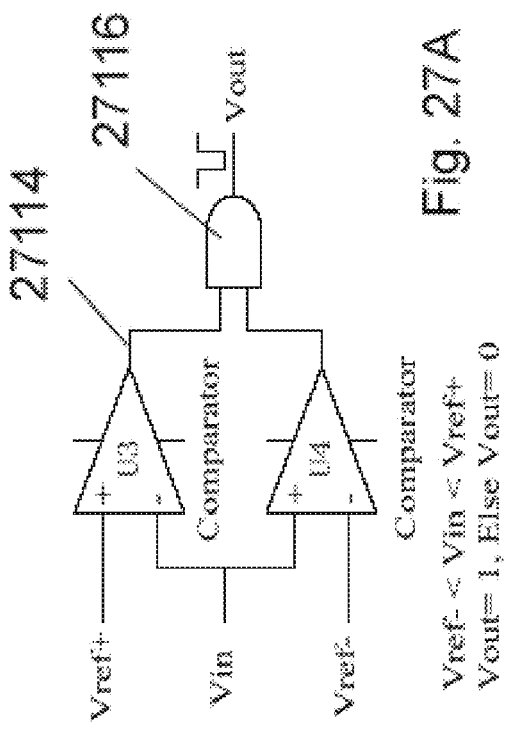
Figure 27C:
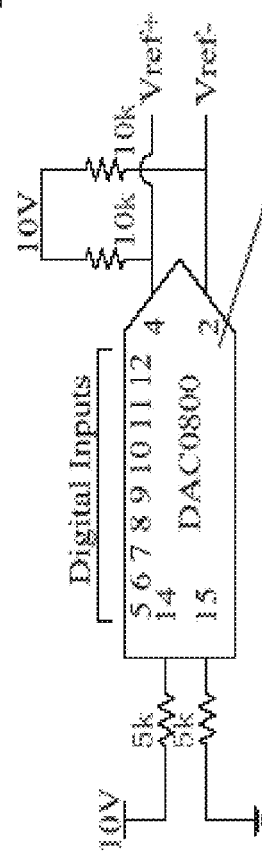

FIGS. 27A to 27C show an exemplary amplitude detection circuit of the present invention. The amplitude detection circuit 2292 includes a reference voltage generating circuit and a comparison circuit. As shown in FIG. 27B, the reference voltage generating circuit is designed to use a D/A convertor 27118 to convert digital inputs from the main controller (FPGA) 2294 to analog DC reference voltages $V_{ref+}$ and $V_{ref-}$, as shown in FIG. 27C. The comparison circuit is designed to use a window comparator 27114 and a AND gate 27116 to compare the attenuated amplitude $V_{in}$ output from the voltage attenuation circuit 2190 with the reference voltages $V_{ref+}$ and $V_{ref-}$, if the attenuated amplitude $V_{in}$ exceeds the reference voltages $V_{ref+}$ and $V_{ref-}$, the amplitude detection circuit 2292 sends out an alarm signal to the host computer 2080 and the host computer 2080 receives the alarm signal and shuts down the sonic power supply 2082 for avoiding damaging patterned structures on the wafer 2010.

The present invention provides a method for cleaning substrate without damaging patterned structure on the substrate using ultra/mega sonic device, including the following steps:

Step 1: applying liquid into a space between a substrate and an ultra/mega sonic device;

Step 2: setting an ultra/mega sonic power supply at frequency $f_1$ and power $P_1$ to drive the ultra/mega sonic device;

Step 3: before bubble cavitation in the liquid damaging the patterned structure on the substrate, setting the ultra/mega sonic power supply at zero output;

Step 4: after temperature inside bubble cooling down to a set temperature, setting the ultra/mega sonic power supply at frequency $f_1$ and power $P_1$ again;

Step 5: detecting power on time at power $P_1$ and frequency $f_1$ and power off time separately;

Step 6: comparing the detected power on time at power $P_1$ and frequency $f_1$ with a preset time $\tau_1$, if the detected power on time is longer than the preset time $\tau_1$, shut down the ultra/mega sonic power supply and send out an alarm signal;

Step 7: comparing the detected power off time with a preset time $\tau_2$, if the detected power off time is shorter than the preset time $\tau_2$, shut down the ultra/mega sonic power supply and send out an alarm signal;

Step 8: repeating step 1 to step 7 till the substrate is cleaned.

In an embodiment, the step 5 further comprises: attenuating amplitude of the waveform output by the ultra/mega sonic power supply; converting sinusoidal wave of which amplitude is attenuated into square wave; converting pulse signal of the power on time to high level signal, and the low level signal of power off time remaining the same; measuring the time of high level and low level for comparing with the preset time $\tau_1$ and the preset time $\tau_2$.

The attenuation rate is set in the range of 5 to 100, and preferably 20.

In an embodiment, the actual power on time is equal to $\tau-\tau_3$, wherein $\tau$ is the measured time of high level, $\tau_3$ is the time of the ultra/mega sonic power supply oscillating several periods after the ultra/mega sonic power supply is shut down. Compare the actual power on time with the preset time $\tau_1$, if the actual power on time is longer than the preset time $\tau_1$, shut down the ultra/mega sonic power supply and send out an alarm signal. The present invention provides another method for cleaning substrate without damaging patterned structure on the substrate using ultra/mega sonic device, including the following steps:

Step 1: applying liquid into a space between a substrate and an ultra/mega sonic device;

Step 2: setting an ultra/mega sonic power supply at frequency $f_1$ and power $P_1$ to drive the ultra/mega sonic device;

Step 3: before bubble cavitation in the liquid damaging patterned structure on the substrate, setting the ultra/mega sonic power supply at zero output;

Step 4: after temperature inside bubble cooling down to a set temperature, setting the ultra/mega sonic power supply at frequency $f_1$ and power $P_1$ again;

Step 5: detecting amplitude of each waveform output by the ultra/mega sonic power supply;

Step 6: comparing detected amplitude of each waveform with a preset value, if the detected amplitude of any waveform is larger than the preset value, shut down the ultra/mega sonic power supply and send out an alarm signal, where the preset value is larger than waveform amplitude at normal operation;

Step 7: repeating step 1 to step 6 till the substrate is cleaned.

In an embodiment, the method further comprises: attenuating amplitude of the waveform output by the ultra/mega sonic power supply; obtaining analog DC reference voltages $V_{ref+}$ and $V_{ref-}$; comparing the attenuated amplitude $V_{in}$ with the reference voltages $V_{ref+}$ and $V_{ref-}$, if the attenuated amplitude $V_{in}$ exceeds the reference voltages $V_{ref+}$ and $V_{ref-}$, shut down the ultra/mega sonic power supply and send out an alarm signal.

The present invention provides an apparatus for cleaning semiconductor substrate using ultra/mega sonic device, comprising a chuck, an ultra/mega sonic device, at least one nozzle, an ultra/mega sonic power supply, a host computer, and a detection system. The chuck holds a semiconductor substrate. The ultra/mega sonic device is positioned adjacent to the semiconductor substrate. The at least one nozzle injects chemical liquid on the semiconductor substrate and a gap between the semiconductor substrate and the ultra/mega sonic device. The host computer sets the ultra/mega sonic power supply at frequency $f_1$ and power $P_1$ to drive the ultra/mega sonic device, before bubble cavitation in the liquid damaging patterned structure on the semiconductor substrate, setting the ultra/mega sonic power supply at zero output, after temperature inside bubble cooling down to a set temperature, setting the ultra/mega sonic power supply at frequency $f_1$ and power $P_1$ again. The detection system detects power on time at power P1 and frequency f1 and power off time separately, comparing the detected power on time at power P1 and frequency f1 with a preset time $\tau_1$, if the detected power on time is longer than the preset time $\tau_1$, the detection system sends out an alarm signal to the host computer, and the host computer receives the alarm signal and shuts down the ultra/mega sonic power supply, comparing the detected power off time with a preset time $\tau_2$, if the detected power off time is shorter than the preset time $\tau_2$, the detection system sends out an alarm signal to the host computer, and the host computer receives the alarm signal and shuts down the ultra/mega sonic power supply.

In an embodiment, the ultra/mega sonic device is further coupled with the nozzle and positioned adjacent to the semiconductor substrate, and the energy of the ultra/mega sonic device is transmitted to the semiconductor substrate through the liquid column out of the nozzle.

The present invention provides another apparatus for cleaning semiconductor substrate using ultra/mega sonic device, comprising a chuck, an ultra/mega sonic device, at least one nozzle, an ultra/mega sonic power supply, a host computer, and a detection system. The chuck holds a semiconductor substrate. The ultra/mega sonic device is positioned adjacent to the semiconductor substrate. The at least one nozzle injects chemical liquid on the semiconductor substrate and a gap between the semiconductor substrate and the ultra/mega sonic device. The host computer sets the ultra/mega sonic power supply at frequency $f_1$ and power $P_1$ to drive the ultra/mega sonic device, before bubble cavitation in the liquid damaging patterned structure on the semiconductor substrate, setting the ultra/mega sonic power supply at zero output, after temperature inside bubble cooling down to a set temperature, setting the ultra/mega sonic power supply at frequency $f_1$ and power $P_1$ again. The detection system detects amplitude of each waveform output by the ultra/mega sonic power supply, comparing detected amplitude of each waveform with a preset value, if detected amplitude of any waveform is larger than the preset value, the detection system sends out an alarm signal to the host computer, and the host computer receives the alarm signal and shuts down the ultra/mega sonic power supply, wherein the preset value is larger than waveform amplitude at normal operation.

In an embodiment, the ultra/mega sonic device is further coupled with the nozzle and positioned adjacent to the semiconductor substrate, and the energy of the ultra/mega sonic device is transmitted to the semiconductor substrate through the liquid column out of the nozzle.

The present invention provides another apparatus for cleaning semiconductor substrate using ultra/mega sonic device, comprising a cassette, a tank, an ultra/mega sonic device, at least one inlet, an ultra/mega sonic power supply, a host computer, and a detection system. The cassette holds at least one semiconductor substrate. The tank holds the cassette. The ultra/mega sonic device is attached to outside wall of the tank. The at least one inlet is used for filling chemical liquid into the tank to immerse the semiconductor substrate. The host computer sets the ultra/mega sonic power supply at frequency $f_1$ and power $P_1$ to drive the ultra/mega sonic device, before bubble cavitation in the liquid damaging patterned structure on the semiconductor substrate, setting the ultra/mega sonic power supply at zero output, after temperature inside bubble cooling down to a set temperature, setting the ultra/mega sonic power supply at frequency $f_1$ and power $P_1$ again. The detection system detects power on time at power P1 and frequency f1 and power off time separately, comparing the detected power on time at power P1 and frequency f1 with a preset time $\tau_1$, if the detected power on time is longer than the preset time $\tau_1$, the detection system sends out an alarm signal to the host computer, and the host computer receives the alarm signal and shuts down the ultra/mega sonic power supply, comparing the detected power off time with a preset time $\tau_2$, if the detected power off time is shorter than the preset time $\tau_2$, the detection system sends out an alarm signal to the host computer, and the host computer receives the alarm signal and shuts down the ultra/mega sonic power supply.

The present invention provides another apparatus for cleaning semiconductor substrate using ultra/mega sonic device, comprising a cassette, a tank, an ultra/mega sonic device, at least one inlet, an ultra/mega sonic power supply, a host computer and a detection system. The cassette holds at least one semiconductor substrate. The tank holds the cassette. The ultra/mega sonic device is attached to outside wall of the tank. The at least one inlet is used for filling chemical liquid into the tank to immerse the semiconductor substrate. The host computer sets the ultra/mega sonic power supply at frequency $f_1$ and power $P_1$ to drive the ultra/mega sonic device, before bubble cavitation in the liquid damaging patterned structure on the semiconductor substrate, setting the ultra/mega sonic power supply at zero output, after temperature inside bubble cooling down to a set temperature, setting the ultra/mega sonic power supply at frequency $f_1$ and power $P_1$ again. The detection system detects amplitude of each waveform output by the ultra/mega sonic power supply, comparing detected amplitude of each waveform with a preset value, if detected amplitude of any waveform is larger than the preset value, the detection system sends out an alarm signal to the host computer, and the host computer receives the alarm signal and shuts down the ultra/mega sonic power supply, wherein the preset value is larger than waveform amplitude at normal operation.

Although the present invention has been described with respect to certain embodiments, examples, and applications, it will be apparent to those skilled in the art that various modifications and changes may be made without departing from the invention.

What is claimed is:

1. A method for cleaning a semiconductor wafer comprising features of patterned structures, the method comprising:
   applying liquid on the semiconductor wafer;
   controlling, based on a timer, a power supply of a transducer to deliver acoustic energy to the liquid at a first frequency and a first power level for a predetermined first time period; and
   controlling, based on the timer, the power supply of the transducer to deliver no acoustic energy to the liquid for a predetermined second time period, wherein the first and second time periods are alternately applied one after another for a predetermined number of cycles;
   detecting a power on time of the power supply; and
   shutting down the power supply when the power on time exceeds a first preset value.

2. The method of claim 1, further comprising transmitting an alarm signal when the power on time exceeds the first preset value.

3. The method of claim 1, further comprising:
   detecting a power off time of the power supply; and
   shutting down the power supply when the power off time is less than a second preset value.

4. The method of claim 3, further comprising transmitting an alarm signal when the power off time is less than the second preset value.

5. The method of claim 1, wherein detecting the power on time of the power supply comprises:
   attenuating an amplitude of a waveform output by the power supply;
   converting the attenuated waveform into a square wave;
   converting a power on portion of the square wave into a first signal output; and
   measuring a period of time associated with the first signal output.

6. The method of claim 5, wherein a ratio of attenuating the amplitude is between 5 and 100.

7. The method of claim 5, wherein the power on time is determined as a value smaller than the measured period of time associated with of the first signal output.

8. The method of claim 7, wherein the power on time is determined as $\tau-\tau_3$, wherein $\tau$ is the measured period of time associated with the first signal output, and wherein $\tau_3$ is a period of time during which the power supply oscillates after the power supply is shut down.

9. A method for cleaning a semiconductor wafer comprising features of patterned structures, the method comprising:
   applying liquid on the semiconductor wafer;
   controlling, based on a timer, a power supply of a transducer to deliver acoustic energy to the liquid at a first frequency and a first power level for a predetermined first time period; and
   controlling, based on the timer, the power supply of the transducer to deliver no acoustic energy to the liquid for a predetermined second time period, wherein the first and second time periods are alternately applied one after another for a predetermined number of cycles;

detecting a power off time of the power supply; and shutting down the power supply when the power off time is less than a preset value.

10. The method of claim 9, further comprising transmitting an alarm signal when the power off time is less than the preset value.

11. A method for cleaning a semiconductor wafer comprising features of patterned structures, the method comprising:

applying liquid on the semiconductor wafer;

controlling, based on a timer, a power supply of a transducer to deliver acoustic energy to the liquid at a first frequency and a first power level for a predetermined first time period; and controlling, based on the timer, the power supply of the transducer to deliver no acoustic energy to the liquid for a predetermined second time period, wherein the first and second time periods are alternately applied one after another for a predetermined number of cycles;

detecting an amplitude of a waveform outputted by the power supply; and shutting down the power supply when the amplitude exceeds a preset amplitude.

12. The method of claim 11, further comprising transmitting an alarm signal when the amplitude exceeds the preset amplitude.

13. The method of claim 11, wherein detecting the amplitude comprises:

attenuating an amplitude of a waveform output by the power supply;

comparing a positive maximum of the attenuated waveform with a first reference voltage; and comparing a negative maximum of the attenuated waveform with a second reference voltage.

14. The method of claim 11, wherein the preset amplitude is larger than waveform amplitude at normal operation.

15. A method for cleaning a semiconductor wafer comprising features of patterned structures, the method comprising:

applying liquid on the semiconductor wafer;

controlling, based on a timer, a power supply of a transducer to deliver acoustic energy to the liquid at a first frequency and a first power level for a predetermined first time period; and controlling, based on the timer, the power supply of the transducer to deliver no acoustic energy to the liquid for a predetermined second time period, wherein the first and second time periods are alternately applied one after another for a predetermined number of cycles;

detecting a power on time of the power supply and a power off time of the power supply; and shutting down the power supply when the power on time exceeds a first preset value or when the power off time is less than a second preset value.

16. The method of claim 15, further comprising transmitting an alarm signal when the power on time exceeds the first preset value or the power off time is less than the second preset value.

* * * * *